United States Patent
Stewart et al.

(10) Patent No.: US 8,308,858 B2
(45) Date of Patent: Nov. 13, 2012

(54) ELECTROLESS DEPOSITION PROCESS ON A SILICON CONTACT

(75) Inventors: Michael P. Stewart, Mountain View, CA (US); Timothy W. Weidman, Sunnyvale, CA (US); Arulkumar Shanmugasundram, Sunnyvale, CA (US); David J. Eaglesham, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 495 days.

(21) Appl. No.: 12/689,176

(22) Filed: Jan. 18, 2010

(65) Prior Publication Data
US 2010/0107927 A1 May 6, 2010

Related U.S. Application Data

(62) Division of application No. 11/385,043, filed on Mar. 20, 2006, now Pat. No. 7,659,203.

(60) Provisional application No. 60/663,493, filed on Mar. 18, 2005, provisional application No. 60/683,599, filed on May 23, 2005, provisional application No. 60/703,538, filed on Jul. 29, 2005, provisional application No. 60/703,633, filed on Jul. 29, 2005, provisional application No. 60/709,564, filed on Aug. 19, 2005, provisional application No. 60/754,230, filed on Dec. 27, 2005, provisional application No. 60/731,624, filed on Oct. 28, 2005.

(51) Int. Cl.
C23C 18/30 (2006.01)
C23C 18/36 (2006.01)

(52) U.S. Cl. ............... 106/1.11; 106/1.22; 106/1.27

(58) Field of Classification Search .......... 106/1.11, 106/1.22, 1.27
See application file for complete search history.

(56) References Cited

U.S. PATENT DOCUMENTS

| 2,369,620 A | 2/1945 | Sullivan et al. |
| 3,403,035 A | 9/1968 | Schneble et al. |
| 3,745,039 A | 7/1973 | Feldstein |

(Continued)

FOREIGN PATENT DOCUMENTS

EP 0329406 8/1989

(Continued)

OTHER PUBLICATIONS

Dubin, et al. "Selective and Blanket Electroless Copper Deposition for Ultralarge Scale Integration," J. Electrochem. Soc., vol. 144, No. 3, Mar. 1997, pp. 898-908.

(Continued)

Primary Examiner — Helene Klemanski
(74) Attorney, Agent, or Firm — Patterson & Sheridan, LLP

(57) ABSTRACT

Embodiments as described herein provide methods for depositing a material on a substrate during electroless deposition processes, as well as compositions of the electroless deposition solutions. In one embodiment, the substrate contains a contact aperture having an exposed silicon contact surface. In another embodiment, the substrate contains a contact aperture having an exposed silicide contact surface. The apertures are filled with a metal contact material by exposing the substrate to an electroless deposition process. The metal contact material may contain a cobalt material, a nickel material, or alloys thereof. Prior to filling the apertures, the substrate may be exposed to a variety of pretreatment processes, such as preclean processes and activations processes. A preclean process may remove organic residues, native oxides, and other contaminants during a wet clean process or a plasma etch process. Embodiments of the process also provide the deposition of additional layers, such as a capping layer.

16 Claims, 13 Drawing Sheets

U.S. PATENT DOCUMENTS

| | | |
|---|---|---|
| 3,937,857 A | 2/1976 | Brummett et al. |
| 4,006,047 A | 2/1977 | Brummett et al. |
| 4,072,781 A | 2/1978 | Shirahata et al. |
| 4,150,177 A | 4/1979 | Guditz et al. |
| 4,232,060 A | 11/1980 | Mallory, Jr. |
| 4,234,628 A | 11/1980 | DuRose |
| 4,239,810 A | 12/1980 | Alameddine et al. |
| 4,265,943 A | 5/1981 | Goldstein et al. |
| 4,297,393 A | 10/1981 | Denning et al. |
| 4,364,803 A | 12/1982 | Nidola et al. |
| 4,366,035 A | 12/1982 | Wilkinson |
| 4,368,223 A | 1/1983 | Kobayashi et al. |
| 4,397,812 A | 8/1983 | Mallory, Jr. |
| 4,424,241 A | 1/1984 | Abys |
| 4,632,857 A | 12/1986 | Mallory, Jr. |
| 4,717,591 A | 1/1988 | Acosta et al. |
| 4,795,660 A | 1/1989 | Cooray et al. |
| 4,808,259 A | 2/1989 | Jillie, Jr. et al. |
| 4,810,520 A | 3/1989 | Wu |
| 4,867,882 A | 9/1989 | O'Neill et al. |
| 5,055,199 A | 10/1991 | O'Neill et al. |
| 5,102,456 A | 4/1992 | Jagannathan et al. |
| 5,141,626 A | 8/1992 | Tanaka et al. |
| 5,147,692 A | 9/1992 | Bengston |
| 5,169,680 A | 12/1992 | Ting et al. |
| 5,169,690 A | 12/1992 | Zimmerman et al. |
| 5,200,048 A | 4/1993 | Tanaka et al. |
| 5,203,911 A | 4/1993 | Sricharoenchaikit et al. |
| 5,212,138 A | 5/1993 | Krulik et al. |
| 5,234,628 A | 8/1993 | Trabitzsch et al. |
| 5,235,139 A | 8/1993 | Bengston et al. |
| 5,240,497 A | 8/1993 | Shacham et al. |
| 5,248,527 A | 9/1993 | Uchida et al. |
| 5,380,560 A | 1/1995 | Kaja et al. |
| 5,478,462 A | 12/1995 | Walsh |
| 5,614,003 A | 3/1997 | Mallory, Jr. |
| 5,674,787 A | 10/1997 | Zhao et al. |
| 5,739,579 A | 4/1998 | Chiang et al. |
| 5,783,495 A | 7/1998 | Li et al. |
| 5,830,805 A | 11/1998 | Shacham-Diamand et al. |
| 5,843,538 A | 12/1998 | Ehrsam et al. |
| 5,846,598 A | 12/1998 | Semkow et al. |
| 5,910,340 A | 6/1999 | Uchida et al. |
| 5,913,147 A | 6/1999 | Dubin et al. |
| 5,965,211 A | 10/1999 | Kondo et al. |
| 5,998,873 A | 12/1999 | Blair et al. |
| 6,046,108 A | 4/2000 | Liu et al. |
| 6,113,771 A | 9/2000 | Landau et al. |
| 6,165,912 A | 12/2000 | McConnell et al. |
| 6,180,523 B1 | 1/2001 | Lee et al. |
| 6,197,364 B1 | 3/2001 | Paunovic et al. |
| 6,249,493 B1 | 6/2001 | Dang |
| 6,258,223 B1 | 7/2001 | Cheung et al. |
| 6,258,409 B1 | 7/2001 | Sale et al. |
| 6,261,637 B1 | 7/2001 | Oberle |
| 6,277,728 B1 | 8/2001 | Ahn et al. |
| 6,277,729 B1 | 8/2001 | Wu et al. |
| 6,291,082 B1 | 9/2001 | Lopatin |
| 6,291,348 B1 | 9/2001 | Lopatin et al. |
| 6,309,967 B1 | 10/2001 | Honeycutt et al. |
| 6,309,969 B1 | 10/2001 | Oskam et al. |
| 6,319,387 B1 | 11/2001 | Krishnamoorthy et al. |
| 6,323,128 B1 | 11/2001 | Sambucetti et al. |
| 6,342,733 B1 | 1/2002 | Hu et al. |
| 6,344,125 B1 | 2/2002 | Locke et al. |
| 6,344,410 B1 | 2/2002 | Lopatin et al. |
| 6,350,364 B1 | 2/2002 | Jang |
| 6,369,429 B1 | 4/2002 | Pramanick et al. |
| 6,372,657 B1 | 4/2002 | Hineman et al. |
| 6,416,647 B1 | 7/2002 | Dordi et al. |
| 6,428,673 B1 | 8/2002 | Ritzdorf et al. |
| 6,431,190 B1 | 8/2002 | Oka et al. |
| 6,432,819 B1 | 8/2002 | Pavate et al. |
| 6,432,821 B1 | 8/2002 | Dubin et al. |
| 6,435,398 B2 | 8/2002 | Hartfield et al. |
| 6,436,267 B1 | 8/2002 | Carl et al. |
| 6,436,816 B1 | 8/2002 | Lee et al. |
| 6,441,492 B1 | 8/2002 | Cunningham |
| 6,486,055 B1 | 11/2002 | Jung et al. |
| 6,503,834 B1 | 1/2003 | Chen et al. |
| 6,516,815 B1 | 2/2003 | Stevens et al. |
| 6,517,894 B1 | 2/2003 | Hongo et al. |
| 6,528,409 B1 | 3/2003 | Lopatin et al. |
| 6,544,399 B1 | 4/2003 | Landau et al. |
| 6,551,483 B1 | 4/2003 | Mayer et al. |
| 6,565,729 B2 | 5/2003 | Chen et al. |
| 6,573,606 B2 | 6/2003 | Sambucetti et al. |
| 6,588,437 B1 | 7/2003 | Higashi |
| 6,596,151 B2 | 7/2003 | Landau et al. |
| 6,605,874 B2 | 8/2003 | Leu et al. |
| 6,616,772 B2 | 9/2003 | de Larios et al. |
| 6,616,967 B1 | 9/2003 | Test |
| 6,620,719 B1 | 9/2003 | Andry et al. |
| 6,632,345 B1 | 10/2003 | Chen |
| 6,638,410 B2 | 10/2003 | Chen et al. |
| 6,645,550 B1 | 11/2003 | Cheung et al. |
| 6,645,567 B2 | 11/2003 | Chebiam et al. |
| 6,680,540 B2 | 1/2004 | Nakano et al. |
| 6,709,563 B2 | 3/2004 | Nagai et al. |
| 6,717,189 B2 | 4/2004 | Inoue et al. |
| 6,743,473 B1 | 6/2004 | Parkhe et al. |
| 6,756,682 B2 | 6/2004 | Sinha et al. |
| 6,787,450 B2 | 9/2004 | Sinha et al. |
| 6,794,288 B1 | 9/2004 | Kolics et al. |
| 6,797,312 B2 | 9/2004 | Kong et al. |
| 6,821,909 B2 | 11/2004 | Ramanathan et al. |
| 6,824,612 B2 | 11/2004 | Stevens et al. |
| 6,824,666 B2 | 11/2004 | Gandikota et al. |
| 6,852,584 B1 | 2/2005 | Chen et al. |
| 6,852,618 B2 | 2/2005 | Chopra |
| 6,881,671 B2 | 4/2005 | Jensen et al. |
| 6,905,622 B2 * | 6/2005 | Padhi et al. ...................... 216/52 |
| 7,064,065 B2 * | 6/2006 | Lopatin et al. ................. 438/678 |
| 7,071,018 B2 | 7/2006 | Mason et al. |
| 7,514,353 B2 | 4/2009 | Weidman et al. |
| 7,659,203 B2 * | 2/2010 | Stewart et al. ................. 438/678 |
| 2001/0042689 A1 | 11/2001 | Chen |
| 2002/0019127 A1 | 2/2002 | Givens |
| 2002/0098681 A1 | 7/2002 | Hu et al. |
| 2002/0098711 A1 | 7/2002 | Klein |
| 2002/0182385 A1 | 12/2002 | Senkevich et al. |
| 2003/0010645 A1 | 1/2003 | Ting et al. |
| 2003/0075808 A1 | 4/2003 | Inoue et al. |
| 2003/0113576 A1 | 6/2003 | Chebiam et al. |
| 2003/0116439 A1 | 6/2003 | Seo et al. |
| 2003/0141018 A1 | 7/2003 | Stevens et al. |
| 2003/0155247 A1 | 8/2003 | Miura et al. |
| 2003/0181040 A1 | 9/2003 | Ivanov et al. |
| 2003/0186535 A1 | 10/2003 | Wong et al. |
| 2003/0189026 A1 | 10/2003 | Padhi et al. |
| 2004/0009883 A1 | 1/2004 | Ikemoto et al. |
| 2004/0035316 A1 | 2/2004 | Chebiam et al. |
| 2004/0038073 A1 | 2/2004 | Chebiam et al. |
| 2004/0065540 A1 | 4/2004 | Mayer et al. |
| 2004/0072419 A1 | 4/2004 | Baskaran et al. |
| 2004/0096592 A1 | 5/2004 | Chebiam et al. |
| 2004/0105934 A1 | 6/2004 | Chang et al. |
| 2004/0113277 A1 | 6/2004 | Chiras et al. |
| 2004/0175509 A1 | 9/2004 | Kolics et al. |
| 2004/0176620 A1 | 9/2004 | Kuperman et al. |
| 2004/0241321 A1 | 12/2004 | Ganguli et al. |
| 2004/0262772 A1 | 12/2004 | Ramanathan et al. |
| 2004/0265501 A1 | 12/2004 | Choi et al. |
| 2005/0006245 A1 | 1/2005 | Sun et al. |
| 2005/0090098 A1 | 4/2005 | Dubin et al. |
| 2005/0118807 A1 | 6/2005 | Kim et al. |
| 2005/0124154 A1 | 6/2005 | Park et al. |
| 2005/0136185 A1 | 6/2005 | Ramanathan et al. |
| 2005/0189013 A1 | 9/2005 | Hartley |
| 2005/0212058 A1 | 9/2005 | Huang et al. |
| 2005/0212139 A1 | 9/2005 | Leinikka et al. |
| 2005/0238808 A1 | 10/2005 | Gatineau et al. |
| 2005/0258499 A1 | 11/2005 | Huang et al. |
| 2006/0246217 A1 * | 11/2006 | Weidman et al. ............ 106/1.22 |
| 2008/0110491 A1 | 5/2008 | Buller et al. |
| 2008/0121276 A1 | 5/2008 | Lopatin et al. |

FOREIGN PATENT DOCUMENTS

| | | |
|---|---|---|
| EP | 0475567 | 3/1992 |
| EP | 0913498 | 5/1999 |
| GB | 2285174 | 6/1995 |
| JP | 59215473 A | 12/1984 |
| JP | 7297543 | 11/1995 |
| JP | 11124682 | 5/1999 |
| WO | WO-8808887 A1 | 11/1988 |

OTHER PUBLICATIONS

Eze, et al. "Chemical-bath-deposited cobalt sulphide films: preparation effects," Marerials Chemistry and Physics, 47 (1997), pp. 31-36.

Eze "Electroless deposition of CoO thin films," J. Phys. D. Appl. Phys. 32 (1998), pp. 533-540.

Georgiou, et al. "Thick Selective Electroless-Plated Cobalt-Nickel Alloy Contacts to CoSi2," J. Electrochem. Soc., vol. 138, No. 7, Jul. 1991, pp. 2061-2069.

Hu, et al. "Reduced electromigration of Cu wires by surface coating," Applied Physics Letters, vol. 81, No. 10, Sep. 2002, pp. 1782-1784.

Lin, et al. "Manufacturing of Cu/Electroless Nickel/Sn-Pb Flip Chip Solder Bumps," IEEE Transactions on Advanced Packaging, vol. 22, No. 4 (Nov. 1999), pp. 575-579.

Lopatin, et al. "Thin Electroless barrier for copper films," Part of the SPIE Conference of Multilevel Interconnect Technology II, SPIE vol. 3508 (1998), pp. 65-77.

Pearlstein, et al. "Electroless Cobalt Deposition from Acid Baths," J. Electrochem. Soc. Electrochemical Science and Technology, Aug. 1974, vol. 121, No. 8, pp. 1023-1028.

Pearlstein "Electroless Plating," J. Res. Natl. Bur. Stan., Ch. 31 (1963), pp. 710-747.

Saito, et al. "Electroless deposition of Ni-B, Co-B and Ni-Co-B alloy using dimethylamineborane as a reducing agent," J. of Appl. Electrochemistry 28 (1998), pp. 559-563.

Shacham-Diamand, et al. "Copper electroless deposition technology for ultra-large-scale-integration (ULSI) metallization," Microelectric Engineering 33 (1997), pp. 47-58.

Shacham-Diamand, et al. "Electrochemically deposited thin film alloys for ULSI and MEMS applications," Microelectronic Engineering 50 (2000), pp. 525-531.

Shacham-Diamand, et al. "Electroless copper deposition for ULSI," Thin Solid Films 262 (1995), pp. 93-103.

Shacham-Diamand, et al. "High Aspect Ratio Quarter-Micron Electroless Copper Integrated Technology," Microelectronic Engineering 37/38 (1997), pp. 77-88.

Shacham-Diamand, et al. "Integrated electrometallization for ULSI," Electrochimica Acta 44 (1999), pp. 3639-3649.

Shacham-Diamand, et al. "Material properties of electrless 100-200 nm thick CoWP films," Electrochemical Society Proceedings, vol. 99-34, pp. 102-110.

Ting, et al. "Selective Electroless Metal Deposition for Via Hole Filling in VLSI Multilevel Interconnection Structures," J. Electrochem. Soc., vol. 136, No. 2, Feb. 1989, pp. 462-465.

Sergey Lopatin "Electrochemical Metallization of Nanostructures: Integrated Circuits and Micro-Electro-Mechamical Systems", Recent Res. Devel. Electrochem., 6(2003): 57-100, ISBN: 81-7895-107-X.

Pan, et al. "Novel Approach to Reduce Source/Drain Series Resistance in High Performance CMOS Devices Using Self-aligned CoWP Process for 45nm Node UTSOI Transistors with 20nm Gate Length," 2006 Symposium on VLSI Technology Digest of Technical Papers 8/06.

Osaka, et al. "Electroless Nickel Ternary Alloy Deposition on SiO2 for Application to Diffusion Barrier Layer in Copper Intercoonect Technology," J. Electrochem. Soc. vol. 149(2002), pp. C573-C578.

Takano, et al. "Mechanism of the Chemical Deposition of Nickel on Silicon Wafers in Aqueous Solution," J. Electrochem. Soc. vol. 146(1999), pp. 1407-1411.

Hsu, et al. "Displacement Activation of Tantalum Diffusion Barrier Layer for Electroless Copper Deposition," J. Electrochem. Soc. vol. 148(2001), pp. C590-C598.

Hong, et al. "the Effect of NH3 Plasma Treatment on the Electroless Copper Deposition on TaNx (x=0=1) Diffusion Barriers," Electrochem. and Solid-State Let. vol. 6(2003), pp. C12-C15.

Wang, et al. "Bopttom-Up Fill for Submicrometer Copper Via Holes of ULSIs by Electroless Plating," J. Electrochem. Soc. vol. 151(2004), pp. C781-C785.

Shingubara, et al. "Bottom-Up Fill of Copper in Deep Submicrometer Holes by Electroless Plating," Electrochem. and Solid-State Let., vol. 7(2004), pp. C78-C80.

Milan Paunovic "Electrochemically Deposited Thin Films," The Electrochem. Soc., Inc., Electrodeposition Division Proceedings vol. 94-31, pp. 293-303.

* cited by examiner

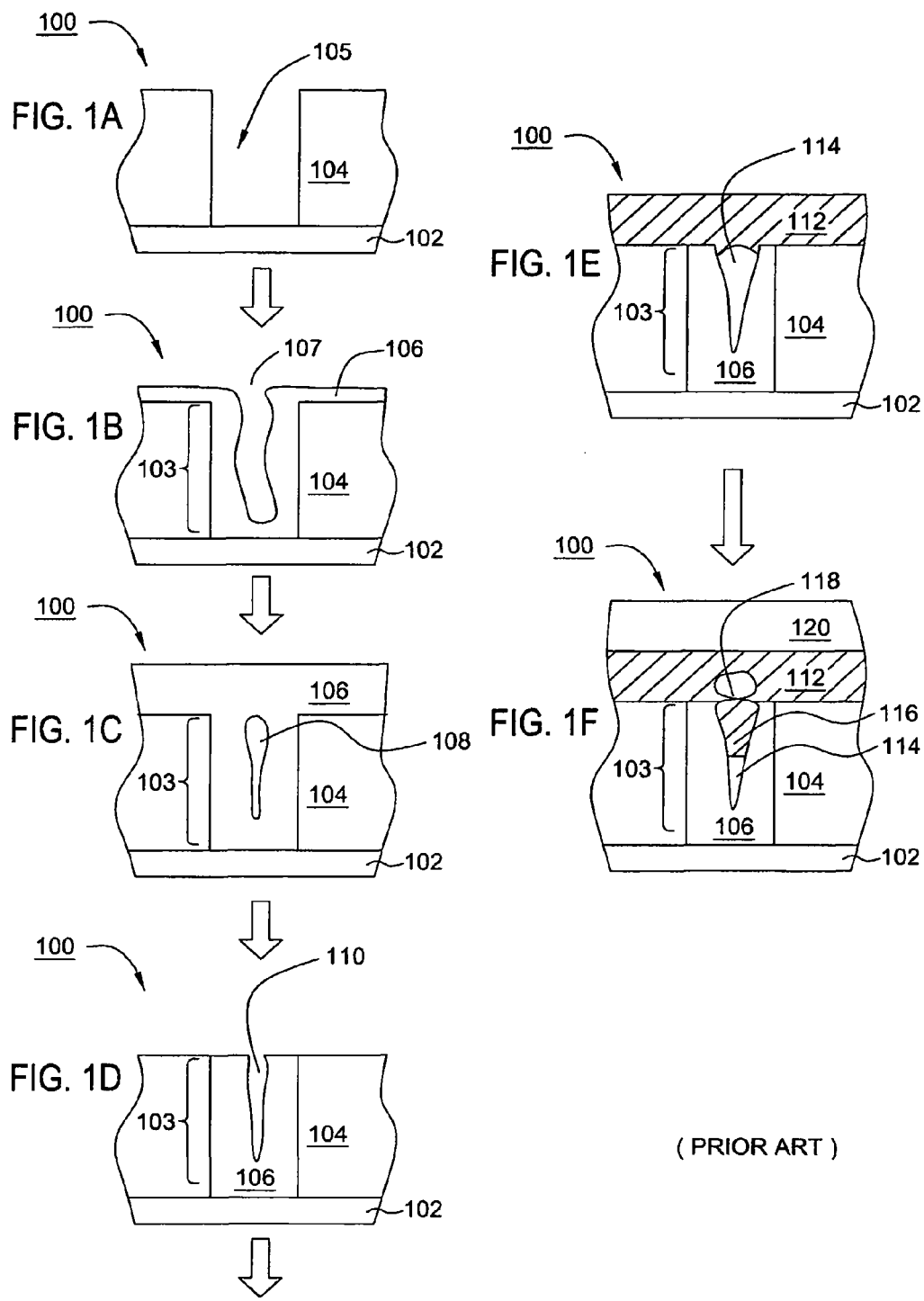
(PRIOR ART)

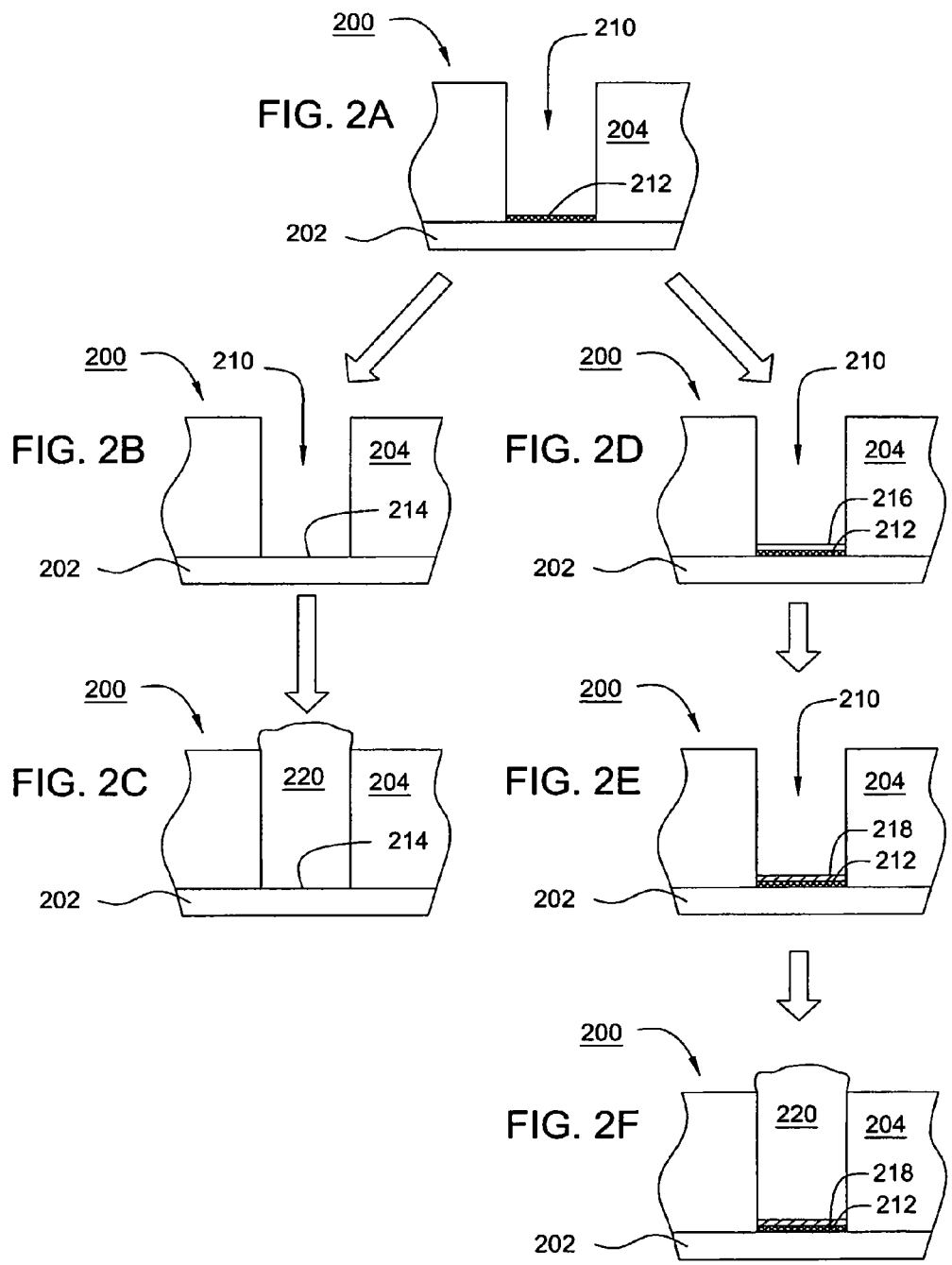

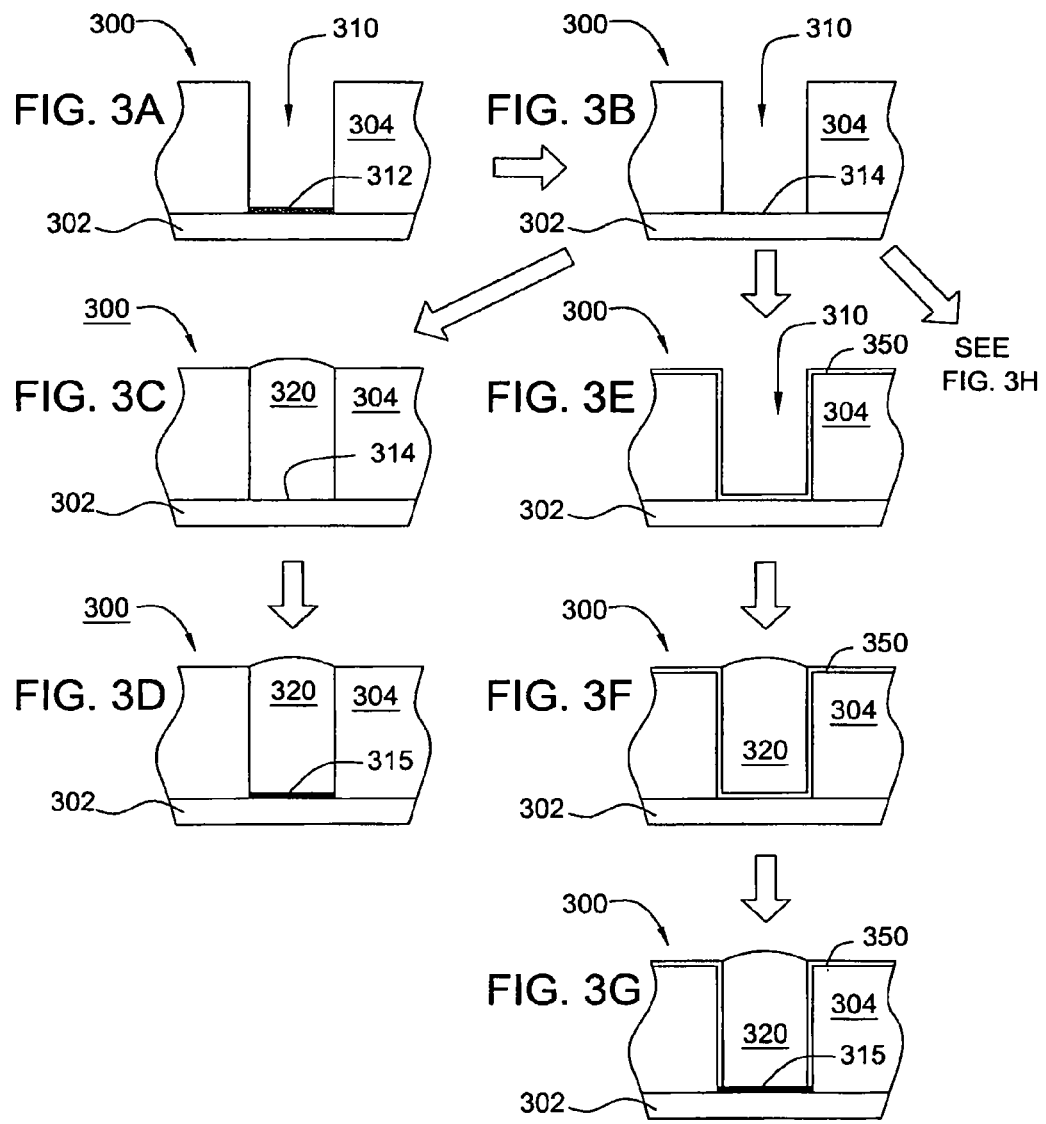

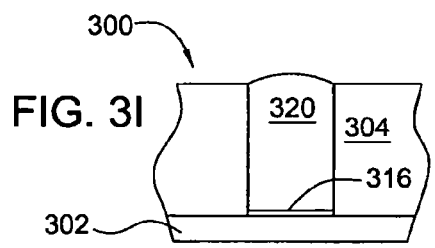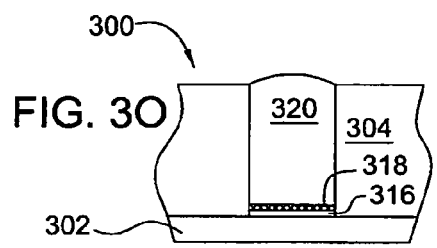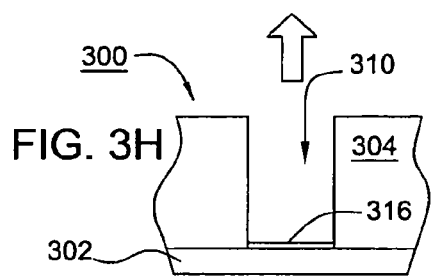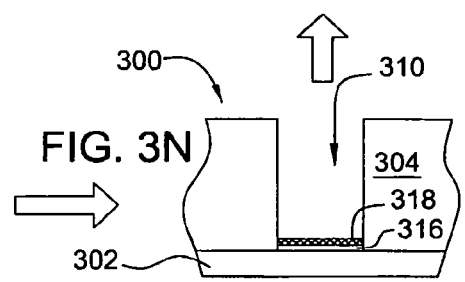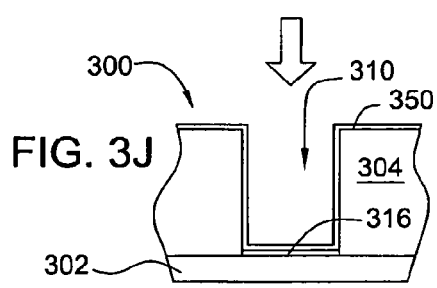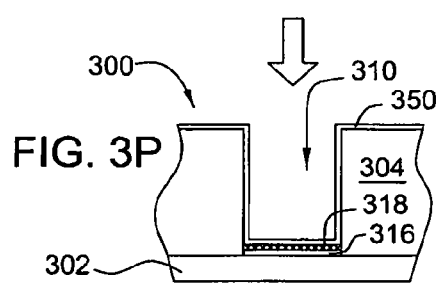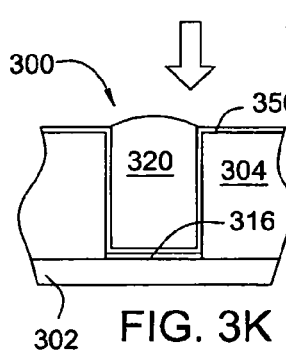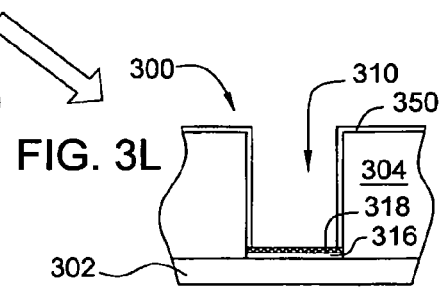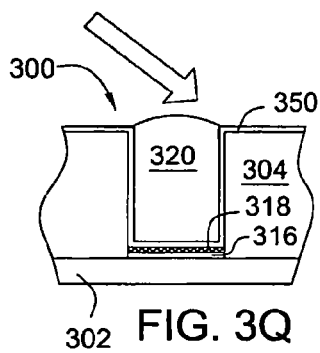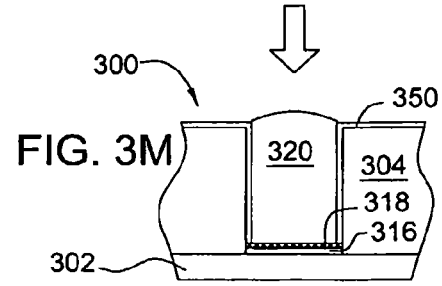

ELECTROLESS DEPOSITION PROCESS ON A SILICON CONTACT

CROSS-REFERENCE TO RELATED APPLICATIONS

This application is a divisional of U.S. Ser. No. 11/385,043, filed Mar. 20, 2006, now U.S. Pat. No. 7,659,203 which claims benefit of U.S. Ser. No. 60/663,493, filed Mar. 18, 2005, U.S. Ser. No. 60/683,599, filed May 23, 2005, U.S. Ser. No. 60/703,538, filed Jul. 29, 2005, U.S. Ser. No. 60/703,633, filed Jul. 29, 2005, U.S. Ser. No. 60/709,564, filed Aug. 19, 2005, U.S. Ser. No. 60/754,230, filed Dec. 27, 2005, and U.S. Ser. No. 60/731,624, filed Oct. 28, 2005, which are all herein incorporated by reference in their entirety.

BACKGROUND OF THE INVENTION

1. Field of the Invention

Embodiments of the invention generally relate to methods for depositing materials on substrates, and more specifically to methods for filling apertures within a high aspect ratio contact.

2. Description of the Related Art

Multilevel, 45 nm node metallization is one of the key technologies for the next generation of very large scale integration (VLSI). The multilevel interconnects that lie at the heart of this technology possess high aspect ratio features, including contacts, vias, lines, and other apertures. Reliable formation of these features is very important for the success of VLSI and the continued effort to increase quality and circuit density on individual substrates. Therefore, there is a great amount of ongoing effort being directed to the formation of void-free features having high aspect ratios of 10:1 (height:width) or greater.

Copper and tungsten are choice metals for filling VLSI features, such as a submicron high aspect ratio contact (HARC) on a substrate. Contacts are formed by depositing a conductive interconnect material, such as copper or tungsten into an aperture (e.g., via) on the surface of an insulating material disposed between two spaced-apart conductive layers. A high aspect ratio of such an opening may inhibit deposition of a conductive interconnect material to fill an aperture. Although copper and tungsten are popular interconnect materials, deposition processes for depositing these materials may suffer by forming a void or a seam within the contact plug, as illustrated in FIG. 1C.

FIGS. 1A-1B depict a schematic cross-sectional view of an integrated circuit device on substrate 100 containing aperture 105 formed in dielectric layer 104 to expose contact layer 102. During a deposition process that may include chemical vapor deposition (CVD) or atomic layer deposition (ALD), metal layer 106 is deposited on dielectric layer 104 and within aperture 105 including on contact layer 102 and the sidewalls of dielectric layer 104 to form plug 103. Near opening 107 of plug 103, metal layer 106 may pinch off, depicted in FIG. 1C, so that plug 103 maintains a seam or void 108 therein. During a subsequent chemical mechanical polishing (CMP) process that removes a portion of metal layer 106 and dielectric layer 104 from the surface of substrate 100, void 108 may be breached or exposed to form gap 110 within plug 103, as illustrated in FIG. 1D. FIG. 1E depicts conductive layer 112 (e.g., copper) deposited on substrate 100 forming void 114 by enclosing gap 110. Substrate 100 may contain additional layers of material depending on the overall architecture of the electronic device. For example, dielectric layer 104 may be covered by a barrier layer (not shown) thereon prior to the deposition of conductive layer 112 or conductive layer 112 may also contain a barrier layer (not shown) thereon prior to the deposition of layer 120.

Defects, such as a seam or void 114, may cause a series of problems during the fabrication of electronic devices depicted herein. The resistance to current flow through plug 103 is impaired due to the lack of conductive material in void 114. However, a more serious obstacle during fabrication is the displacement of voids from one layer to the next. For example, subsequent fabrication processes of substrate 100 may include the deposition of layer 120 (e.g., dielectric layer) on conductive layer 112. During subsequent thermal processing, such as an annealing process, material 116 from conductive layer 112 may diffuse into void 114 and form void 118 within conductive layer 112. As illustrated in FIG. 1F, material 116 may not diffuse completely to the bottom of void 114. The defect formed in conductive layer 112, such as void 118, will increase the resistance of the circuit containing the defect and thus affect device performance. Ultimately, the defects in conductive layer 112 can affect the device yield of the fabricated substrate.

Therefore, a need exists for a method to fill a contact level aperture with a conductive contact material, such that the contact material is deposited free of voids, seams and other defects.

SUMMARY OF THE INVENTION

Embodiments as described herein provide methods for depositing a material on a substrate during electroless deposition processes. In one embodiment, the substrate contains a contact aperture having an exposed silicon contact surface. In another embodiment, the substrate contains a contact aperture having an exposed silicide contact surface. The apertures are filled with a metal contact material by exposing the substrate to an electroless deposition process. The metal contact material may contain a cobalt material, a nickel material, or alloys thereof. Prior to filling the apertures, the substrate may be exposed to a variety of pretreatment processes, such as preclean processes and activations processes. A preclean process may remove organic residues, native oxides, and other contaminants during a wet clean process or a plasma etch process. Embodiments of the process also provide the deposition of additional layers, such as a capping layer.

In one embodiment, a method for depositing a material on a substrate is provided which includes positioning a substrate within a process chamber, wherein the substrate contains an aperture containing an exposed silicon contact surface, exposing the substrate to a preclean process to remove native oxides or contaminants from the exposed silicon contact surface, and exposing the substrate to a first electroless deposition process to form a metal-containing layer on the exposed silicon contact surface. In one embodiment, the aperture is filled with the metal-containing layer during the first electroless deposition process. In another embodiment, the aperture is filled with a metal contact material during a second electroless deposition process. The metal-containing layer and the metal contact materials as described herein may contain nickel, nickel phosphide, nickel boride, cobalt, cobalt tungsten, cobalt tungsten phosphide, cobalt tungsten boride, cobalt tungsten phosphide boride, cobalt nickel, cobalt phosphide, cobalt boride, cobalt nickel phosphide, cobalt nickel boride, derivatives thereof, alloys thereof, or combinations thereof.

In another embodiment, the substrate is exposed to a plasma to remove native oxides or contaminants from the exposed silicon contact surface during the preclean process.

In one example during the plasma etch process, a thin film may be formed on the substrate by the plasma and subsequently, the thin film is removed by a vacuum sublimation process. The substrate is usually exposed to the plasma along with a process gas. In one example, the process gas contains a gas mixture of ammonia and nitrogen trifluoride. The gas mixture may have a molar ratio of the ammonia to the nitrogen trifluoride within a range from about 1:1 to about 30:1.

In other embodiments, the substrate is exposed to a wet clean process. In one example, the substrate is exposed to a wet clean solution containing hydrogen fluoride and a basic compound, such as ammonium hydroxide, tetramethylammonium hydroxide, ethanolamine, diethanolamine, triethanolamine, derivatives thereof, salts thereof, or combinations thereof. In another example, the wet clean solution contains an EA-HF complex, a DEA-HF complex, a TEA-HF complex, a DEA-EA-HF complex, a DEA-TEA-HF complex, a TEA-EA-HF complex, derivatives thereof, salts thereof, or combinations thereof. In another example, the wet clean solution contains hydrogen peroxide and at least one basic compound. In another example, the wet clean solution contains hydrogen peroxide and hydrogen chloride.

In another embodiment, the substrate is exposed to an activation solution containing a reducing agent that contains a metal compound, such as a titanium compound, an iron compound, a chromium compound, alloys thereof, or combinations thereof. In one example, the reducing agent contains a variable-valence metal, such as $Ti^{3+}/Ti^{4+}$, $Fe^{2+}/Fe^{3+}$, or $Cr^{2+}/Cr^{3+}$. The reducing agent may have a halide ligand, a complexing agent ligand, or both. The complexing agent may include carboxylic acids, dicarboxylic acids, polycarboxylic acids, amino acids, amines, diamines, polyamines, alkylamines, alkanolamines, alkoxyamines, or combinations thereof. In one example, the reducing agent contains a variable-valence metal having a citrate ligand, for example, titanium citrate.

In another embodiment, a method for depositing a material on a substrate is provided which includes positioning a substrate within a process chamber, wherein the substrate has an aperture containing either an exposed silicon contact surface or an exposed silicide contact surface, and the aperture is filled with a cobalt-nickel stack material during an electroless deposition process. The substrate may be optionally rinsed after each exposure of the first electroless solution and the second electroless solution. Generally, a process cycle of the sequential exposures of the first and second electroless solutions is repeated to form the metal contact material as a cobalt-nickel stack material having a predetermined thickness. The electroless deposition process includes sequentially exposing the substrate to a first electroless solution containing a cobalt source and to a second electroless solution containing a nickel source. The cobalt-nickel stack material may have a first layer containing cobalt, cobalt phosphide, cobalt boride, cobalt tungsten, cobalt tungsten phosphide, cobalt tungsten boride, cobalt tungsten phosphide boride, derivatives thereof, alloys thereof, or combinations thereof, and a second layer containing nickel, nickel phosphide, nickel boride, derivatives thereof, alloys thereof, or combinations thereof.

In other embodiments described herein, a substrate may be exposed to an activation solution prior to forming a metal-containing layer. In one embodiment, the activation solution contains a cobalt source, a fluoride source, and a hypophosphite source. For example, an activation solution may contain a cobalt source at a concentration within a range from about 1 mM to about 100 mM, a fluoride source at a concentration within a range from about 10 mM to about 400 mM, and a hypophosphite source at a concentration within a range from about 5 mM to about 150 mM. The hypophosphite source may contain sodium hypophosphite, potassium hypophosphite, ammonium hypophosphite, tetramethylammonium hypophosphite, salts thereof, derivatives thereof, or combinations thereof. The fluoride source may contain ethanolammonium fluoride, diethanolammonium fluoride, triethanolammonium fluoride, tetramethylammonium fluoride, ammonium fluoride, hydrogen fluoride, salts thereof, derivatives thereof, or combinations thereof.

In one example, a method for depositing a material on a substrate is provided which includes positioning a substrate within a process chamber, wherein the substrate has an aperture containing an exposed silicon contact surface, exposing the substrate to a preclean process to remove native oxides or contaminants from the exposed silicon contact surface, exposing the substrate to an activation solution to form a metal silicide layer on the exposed silicon contact surface, and filling the aperture with a metal contact material during an electroless deposition process.

In one embodiment, a composition of an activation solution is provided which includes a cobalt source at a concentration within a range from about 1 mM to about 100 mM, a fluoride source at a concentration within a range from about 10 mM to about 400 mM, and a hypophosphite source at a concentration within a range from about 5 mM to about 150 mM. In one example, the activation solution may contain a cobalt source at a concentration within a range from about 5 mM to about 50 mM, a fluoride source at a concentration within a range from about 20 mM to about 200 mM, and a hypophosphite source at a concentration within a range from about 10 mM to about 80 mM. In another example, the activation solution may contain a cobalt source at a concentration within a range from about 10 mM to about 30 mM, the fluoride source at a concentration within a range from about 50 mM to about 120 mM, and the hypophosphite source at a concentration within a range from about 20 mM to about 60 mM. In another example, the activation solution may contain a cobalt source at a concentration of about 20 mM, the fluoride source at a concentration of about 80 mM, and the hypophosphite source at a concentration of about 40 mM. The activation solution contains a hydrogen fluoride salt, such as a salt complex of one, two, or more alkanolamine compounds. The alkanolamine compounds include ethanolamine, diethanolamine, triethanolamine, derivatives thereof, or combinations thereof. In one example, a molar ratio of a first alkanolamine compound to a second alkanolamine compound is within a range from about 1 to about 5, such as about 1.2. In a preferred example, the first alkanolamine compound is diethanolamine and the second alkanolamine compound is triethanolamine.

In other embodiments, a composition of an activation solution provides that the fluoride source has a chemical formula of $[R_4N][F]$, where each R is independently hydrogen, an alkyl group, an alkanol group, derivatives thereof, or combinations thereof. In one example, the fluoride source has a chemical formula of $[(HO(CH_2)_n)_m NH_{4-m}][F]$, where n=1, 2, 3, 4, or 5, and m=1, 2, 3, or 4. In another example, the fluoride source has a chemical formula of $[(HOCH_2CH_2)_m NH_{4-m}][F]$, where m=1, 2, 3, or 4. The fluoride source may contain ethanolammonium fluoride, diethanolammonium fluoride, triethanolammonium fluoride, tetramethylammonium fluoride, ammonium fluoride, hydrogen fluoride, salts thereof, derivatives thereof, or combinations thereof. The hypophosphite source may contain sodium hypophosphite, potassium hypophosphite, ammonium hypophosphite, tetramethylammonium hypophosphite, salts thereof, derivatives thereof, or combinations thereof.

In other embodiments, a capping layer is deposited on an exposed silicide contact surface prior to filling the aperture with the metal contact material. The capping layer may contain cobalt tungsten phosphide, cobalt tungsten boride, cobalt tungsten phosphide boride, derivatives thereof, alloys thereof, or combinations thereof. The capping layer may be formed or deposited by a vapor deposition process, but preferably is deposited during an electroless deposition process. In another embodiment, a self assembled monolayer (SAM-layer) may be deposited within the aperture prior to forming the metal contact material.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

FIGS. 1A-1F illustrate schematic cross-sectional views of an integrated circuit formed by a process described in the art;

FIGS. 2A-2F illustrate schematic cross-sectional views of integrated circuits formed by deposition processes described within embodiments herein;

FIGS. 3A-3Q illustrate schematic cross-sectional views of integrated circuits formed by other deposition processes described within embodiments herein;

DETAILED DESCRIPTION OF THE PREFERRED EMBODIMENT

Figure 4A:
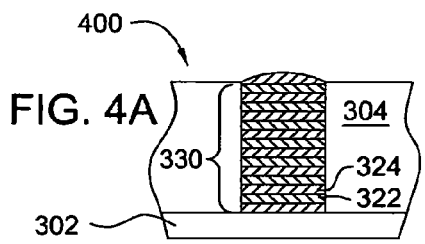
FIGS. 4A-4H illustrate schematic cross-sectional views of integrated circuits formed by another deposition process described within embodiments herein.

Embodiments as described herein provide methods for depositing a material on a substrate during electroless deposition processes. In one embodiment, the substrate contains a contact aperture having an exposed silicon contact surface. In another embodiment, the substrate contains a contact aperture having an exposed silicide contact surface. The apertures are filled with a metal contact material by exposing the substrate to an electroless deposition process. The metal contact material may contain a cobalt material, a nickel material, and alloys thereof. Prior to filling the apertures, the substrate may be exposed to a variety of pretreatment processes, such as preclean processes and activations processes. A preclean process may remove organic residues, native oxides, and other contaminants during a wet clean process or a plasma etch process. Embodiments of the process also provide the deposition of additional layers, such as a capping layer.

Metal-Containing Interconnect Processes

FIG. 2A illustrates a cross-sectional view of substrate 200 having aperture 210 formed into dielectric layer 204. Aperture 210 may include features, such as contact holes, vias, or trenches. Dielectric layer 204 contains an insulating material that includes silicon oxide, silicon nitride, silicon on insulator (SOI), silicon oxynitride, fluorine-doped silicate glass (FSG), or carbon-doped silicon oxides, such as $SiO_xC_y$, for example, BLACK DIAMOND® low-k dielectric, available from Applied Materials, Inc., located in Santa Clara, Calif.

Aperture 210 may be formed in dielectric layer 204 using conventional lithography and etching techniques to expose interconnect layer 202, such as a bit line layer. Interconnect layer 202 contains a conductive metal such as copper, tungsten, aluminum or alloys thereof. Oxide surface 212 is usually formed upon the oxidation of interconnect layer 202 subsequent to etching and ashing processes used to form aperture 210. Oxide surface 212 may be a continuous or a discontinuous layer across the surface of interconnect layer 202 and includes a surface terminate with oxygen, hydrogen, hydroxides, metals, or combinations thereof. In this configuration, interconnect layer 202 may contain oxide surface 212.

FIGS. 2A-2C illustrate cross-sectional views of an electronic device at different stages of an interconnect fabrication sequence incorporating one embodiment of the invention for pre-treating and subsequently filling aperture 210 with a nickel-containing material or a cobalt-tungsten alloy. FIG. 2B illustrates substrate 200 after exposing oxide surface to a pretreatment process. Contact surface 214 of interconnect layer 202 is exposed and is free of or substantially free of oxide surface 212. In one aspect, oxide surface 212 may be chemically reduced to a tungsten metal. For example, oxide surface 212 is exposed to a hydrogen plasma to remove the oxygen and form an oxide free contact surface 214. In another example, oxide surface 212 may be exposed to a vapor deposition process containing diborane to remove oxygen and form contact surface 214 containing tungsten boride. In another aspect, oxide surface 212 is exposed to a wet clean process to further oxidize and remove tungstate ion while leaving behind a clean contact surface 214. Additives, such as surface chelators, may be used within the wet clean solution that adhere to the freshly prepared contact surface 214 and prohibit excess oxidization.

A plasma pretreatment process may be conducted for a predetermined time to reduce oxide surface 212, leaving a substantially oxide-free contact surface 214. A plasma pretreatment process may occur for about 5 minutes or less, preferably, within a range from about 1 second to about 60 seconds, more preferably, from about 5 seconds to about 30 seconds. During the pretreatment process, the substrate is maintained at a temperature within a range from about 20° C. to about 150° C., preferably, from about 50° C. to about 100° C. The process chamber may have a pressure within a range from about 0.1 Torr to about 450 Torr, preferably, from about 1 Torr to about 100 Torr, and more preferably, from about 10 Torr to about 30 Torr.

The plasma treatment process may be conducted in a process chamber capable of plasma vapor deposition techniques. For example, the substrate may be placed into a plasma enhanced ALD (PE-ALD), a plasma enhanced CVD (PE- CVD) or high density plasma CVD (HDP-CVD) chamber, such as the ULTIMA HDP-CVD®, available from Applied Materials, Inc., located in Santa Clara, Calif. An inductively coupled plasma generating device, capacitively coupled plasma generating device, or combination thereof may be used in a plasma chamber to carryout the plasma treatment process.

Oxide surface 212 may be exposed to a reducing plasma containing the reductant to form a substantially oxide-free contact surface 214. The reductant may be diluted in a carrier gas and includes hydrogen, diborane, silane, disilane, phosphine, derivatives thereof, or combinations thereof. During the plasma pretreatment process, a carrier gas flow is established within the process chamber and exposed to the substrate. Carrier gases may be selected so as to also act as a purge gas for the removal of volatile reactants and/or by-products from the process chamber. Carrier gases or purge gases include helium, argon, hydrogen, forming gas, or combinations thereof. The carrier gas may be provided at a flow rate within a range from about 500 sccm to about 5,000 sccm, preferably, from about 500 sccm to about 2,500 sccm. The reductant may be provided at a flow rate within a range from about 5 sccm to about 500 sccm, preferably, from about 10 sccm to about 100 sccm. The plasma may be formed using an RF power delivered to the plasma generating devices (e.g., showerhead in a capacitively coupled chamber or a substrate support) utilized in the plasma chamber where the RF power ranges from about 100 W to about 10,000 W at an RF frequency between about 0.4 kHz and about 10 GHz. In one aspect, the plasma is formed using a showerhead RF power setting and a substrate support RF power setting that is within a range between about 500 W and about 5,000 W at a frequency of about 13.56 MHz.

In an exemplary plasma pretreatment process, the substrate is heated to about 50° C. and the process chamber is maintained at a pressure of about 10 Torr, to reduce the oxides formed on contact surface 214. The substrate may be exposed to a reducing plasma containing hydrogen at a flow rate of about 1,000 sccm for a time period of about 30 seconds to remove oxide layer 212.

In another exemplary plasma pretreatment process, a substrate is heated to about 50° C., the process chamber is maintained at a pressure of about 10 Torr using a flow rate of about 50 sccm of diborane and about 450 sccm of a helium carrier gas to reduce the oxides formed on contact surface 214. The substrate is exposed to the reducing plasma for about 30 seconds to remove the oxide layer 212.

In another embodiment, the pretreatment process may be a liquid reduction process, whereas oxide surface 212 is exposed to a reducing solution to form contact surface 214. The reducing solutions may contain at least one metal-reductant, such as a compound containing a variable-valence metal. Variable-valence metals are utilized as metal-reductants due to the availability of electrons between redox states and include compounds of $Ti^{3+}/Ti^{4+}$, $Fe^{2+}/Fe^{3+}$, $Cr^{2+}/Cr^{3+}$ and $Sn^{2+}/Sn^{4+}$. Metal-reductants containing variable-valence metals may contain a variety of anionic ligands including complexing agents and halides, such as chlorides, fluorides, bromides or iodides. Complexing agents that are useful may have functional groups that include carboxylic acids, dicarboxylic acids, polycarboxylic acids, amino acids, amines, diamines, polyamines, alkylamines, alkanolamines and alkoxyamines. Complexing agents may include citric acid, glycine, ethylenediamine (EDA), monoethanolamine, diethanolamine (DEA), triethanolamine (TEA), derivatives thereof, salts thereof or combinations thereof. In one embodiment, citric acid or a citrate salt is a preferred complexing agent within a reducing solution. For example, a reducing solution may contain titanium salts with carboxylic acid ligands, such as a citrate.

Generally, the reducing solutions are formed in water by combining a metal halide (e.g., titanium chloride containing $TiCl_3$ and $TiCl_4$) with a salt containing a predetermined ligand (e.g., trisodium citrate) to form a metal complex or a metal salt that contains the predetermined ligand (e.g., titanium citrate) having a variable-valence state. The reducing solution may further contain additives such as various chelators, surfactants, pH adjusting agents, or combinations thereof. Variable-valence metal compounds and reducing solutions are further described in V. V. Sviridov et al., "Use of Ti(III) Complexes to reduce Ni, Co, and Fe in Water Solution," J. Phys. Chem., vol. 100, pp. 19632-19635, (1996), M. Majima et al., "Development of Titanium Redox Electroless Plating Method," SEI Technical Review, vol. 54, pp. 67-70, (June 2002), S, Nakao et al., "Electroless Pure Nickel Plating Process with Continuous Electrolytic Regeneration System," Surface and Coatings Technology, vols. 169-170(1), pp. 132-134, (Jun. 2, 2003), which are each incorporated by reference to the extent not inconsistent with the claimed aspects and description herein.

In an effort to remove oxide surface 212, substrate 200 is exposed to a reducing solution for a predetermined time to remove the oxides from contact surface 214. The liquid reduction process may occur for about 5 minutes or less, preferably within a range from about 1 second to about 120 seconds, more preferably, from about 5 seconds to about 90 seconds. During the liquid reduction process, the substrate is heated to a temperature within a range from about 20° C. to about 150° C., preferably, from about 50° C. to about 100° C.

In another embodiment, the pretreatment process may be a vapor deposition process, whereas oxide surface 212 is exposed to a reducing vapor to form contact surface 214. The reductant may include borane, diborane, borane-alkylsulfides, such as borane-dimethylsulfide $(BH_3.(CH_3)_2S)$, alkyboranes (e.g., ethylborane), phosphine, alkylposphines (e.g., dimethylphosphine), silane, disilane, trisilane, alkylsilanes (e.g., methylsilane), ammonia, hydrazine, hydrogen, derivatives thereof, or combinations thereof. Preferably, the reductant is diborane, phosphine, silane, hydrazine, hydrogen, or combinations thereof.

In an effort to remove the oxide surface 212 the substrate 200 is exposed to a reducing vapor process for a predetermined time to remove the oxides from the contact surface 214. The reducing vapor process may occur for about 5 minutes or less, preferably within a range from about 1 second to about 120 seconds, more preferably, from about 5 seconds to about 90 seconds. During the reducing vapor process, the substrate is maintained at a temperature within a range from about 20° C. to about 150° C., preferably, from about 50° C. to about 100° C. The process chamber may have a pressure within a range from about 0.1 Torr to about 450 Torr, preferably, from about 1 Torr to about 100 Torr, and more preferably, from about 10 Torr to about 30 Torr.

In one aspect, the reductant used to remove oxide layer 212 may be diluted in a carrier gas. During the reducing vapor process, a carrier gas flow is established within the process chamber and exposed to the substrate. Carrier gases may be selected so as to also act as a purge gas for the removal of volatile reactants and/or by-products from the process chamber. Carrier gases or purge gases include helium, argon, nitrogen, hydrogen, forming gas, mixtures thereof. The carrier gas may be provided at a flow rate within a range from about 100 sccm to about 5,000 sccm, preferably, from about 500 sccm to about 2,500 sccm. The reductant may be provided at a flow rate within a range from about 5 sccm to about 500 sccm, preferably, from about 10 sccm to about 100 sccm.

The reducing vapor process may be conducted in a process chamber capable of vapor deposition, such as an ALD process chamber or a CVD process chamber. A process chamber useful for ALD during the reducing vapor process is described in commonly assigned U.S. Pat. Nos. 6,916,398 and 6,878,206, which are both incorporated herein by reference.

In another embodiment, oxide surface 212 is removed by further oxidizing by a wet clean process which includes dispensing a wet clean solution across or sprayed on the surface of substrate 200. The wet clean process may be an in situ process performed in the same processing cell as a subsequent electroless deposition process. Alternatively, substrate 200 may be wet cleaned in a separate processing cell from the subsequent electroless deposition processing cell. The wet clean process usually includes an acidic wet clean solution with a pH of about 4 or less, preferably, within a range from about 1.5 to about 3. Oxide surface 212 having a tungsten oxide typically requires an aggressive cleaning at low pH values. The pH value of the wet clean solution is usually adjusted by adding an acid or a base to the predetermined value. The acid may include hydrochloric acid, sulfuric acid, nitric acid, phosphoric acid, derivatives thereof, or combinations thereof. The base may include a hydroxide salt, ammonia or an amine, such as ethanolamine (EA), diethanolamine (DEA), triethanolamine (TEA), derivatives thereof, salts thereof, or combinations thereof. The wet clean solution also contains at least one chelator or complexing agent, such as a carboxylic acid or carboxylate, for example, a citrate, oxalic acid, glycine, salts thereof, or combinations thereof. In one example, the wet clean solution contains about 0.05 M to about 0.5 M of citric acid and optionally up to about 0.25 M of methanesulfonic acid.

Once oxide surface 212 is removed or reduced to reveal contact surface 214 by the processes described herein, fill material 220 may be deposited thereon. FIG. 2C illustrates substrate 200 after fill material 220 has been deposited on contact surface 214. Fill material 220 is composed of a conductive material and preferably deposited by an electroless deposition process. A conductive material deposited as fill material herein includes nickel, cobalt, tungsten, cobalt-tungsten alloys, alloys thereof, or combinations thereof. In one example, fill material 220 is a nickel-containing layer deposited by an electroless deposition solution. In another example, fill material 220 is a cobalt-containing layer (e.g., CoW-alloy) deposited by an electroless deposition solution.

In an alternative embodiment, FIGS. 2A, 2D-2F illustrate cross-sectional views of an electronic device at different stages of an interconnect fabrication sequence to pretreat and subsequently fill aperture 210 with a conductive material. Nickel or cobalt-tungsten alloys are used as conductive materials to fill aperture 210. FIG. 2D illustrates substrate 200 after a pretreatment process has been performed on the oxide surface 212. In one aspect of the pretreatment process a ruthenium oxide layer 216 is deposited by exposing substrate 200 and oxide surface 212 to a ruthenium tetroxide ($RuO_4$) vapor. Thereafter, ruthenium oxide layer 216 may be chemically reduced to form ruthenium-containing layer 218 on oxide surface 212, as illustrated in FIG. 2E.

A ruthenium containing layer may be deposited on the substrate by use of a vapor deposition process, such as an in situ generated process, or in a liquid deposition process, such as an aqueous solution or suspension. Preferably, ruthenium tetroxide is generated in situ by exposing a ruthenium-containing source to an oxidizing gas prior and exposing the product to oxide surface 212. Ruthenium tetroxide is a strong oxidant and therefore readily reacts with any exposed metal oxide (e.g., tungsten oxide) layers to form a consistent and catalytic active layer of ruthenium oxide.

In one example of forming ruthenium tetroxide, ozone gas is produced by supplying an oxygen source gas into an ozone generator. The oxygen source may include oxygen ($O_2$), nitrous oxide ($N_2O$), nitric oxide (NO), nitrogen dioxide ($NO_2$), or combinations thereof. Preferably, a 12 vol % ozone is generated by flowing oxygen through the ozone generator. The oxidizing gas containing ozone may be purified when passed or bubbled through a silicon gel. Subsequently, the ozone is exposed to a metallic ruthenium source to form ruthenium tetroxide that is condensed in a cooled cold trap. The ozone flow is stopped and the cold trap is purged with an inert gas (e.g., nitrogen) to rid the line of excess oxygen. Thereafter, the cold trap is warmed to a temperature to sublime the ruthenium tetroxide while a flow of inert gas is passed therethrough. The vaporized ruthenium tetroxide saturates the inert gas to form a deposition gas.

In an exemplary vapor deposition process, a deposition gas containing ruthenium tetroxide is delivered to a substrate having a tungsten oxide layer formed thereon. During the process, the substrate is maintained at a temperature of about 100° C. After exposing oxide surface 212 to the ruthenium tetroxide containing gas for about 30 seconds, ruthenium oxide layer 216 is formed on the tungsten oxide layer.

Ruthenium oxide layer 216 may be exposed to a reductant forming ruthenium-containing layer 218. The ruthenium oxide is chemically reduced to ruthenium metal. For example, ruthenium oxide layer 216 may be exposed to a hydrogen plasma to remove the oxygen and form metallic ruthenium-containing layer 218. In another example, ruthenium oxide layer 216 may be exposed to a vapor deposition process containing diborane to remove oxygen and form ruthenium-containing layer 218 containing ruthenium boride. In another example, ruthenium oxide layer 216 is exposed to phosphine through a vapor deposition process to remove oxygen and form ruthenium-containing layer 218 containing ruthenium phosphide.

Fill material 220 may be deposited on ruthenium-containing layer 218 to fill aperture 210 as illustrated in FIG. 2F. Fill material 220 contains nickel or a cobalt-tungsten alloy. The electroless deposition process and the composition of fill material 220 are previously described above for substrate 200 depicted in FIG. 2C.

Silicon-Containing Interconnect Processes

Figure 4B:
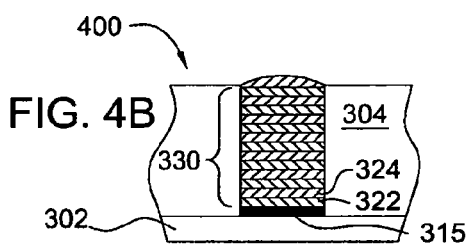
Figure 4C:
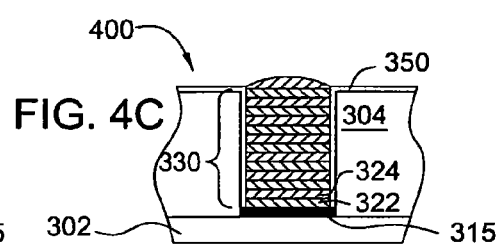
Figure 4D:
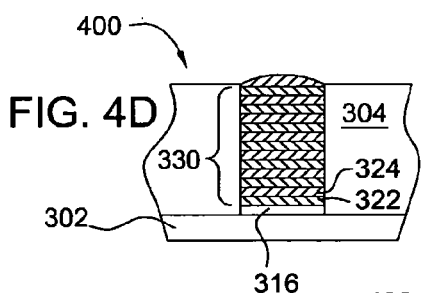
Figure 4E:
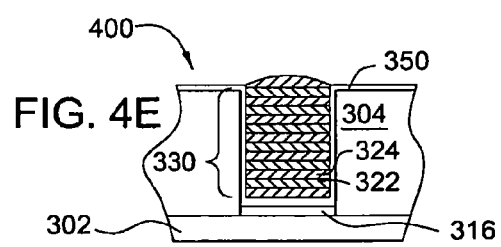
Figure 4F:
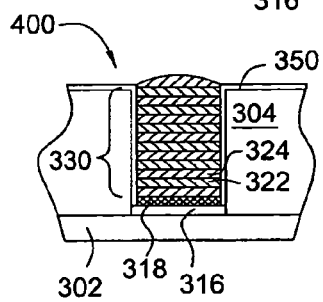
Figure 4G:
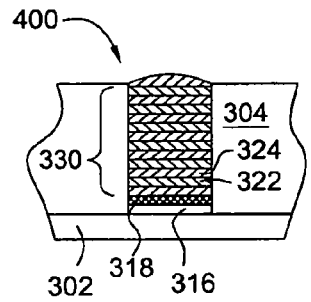
Figure 4H:
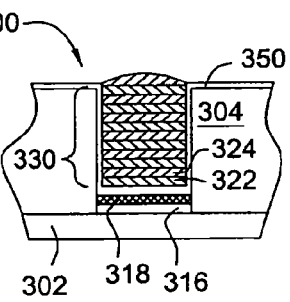
Figure 5:
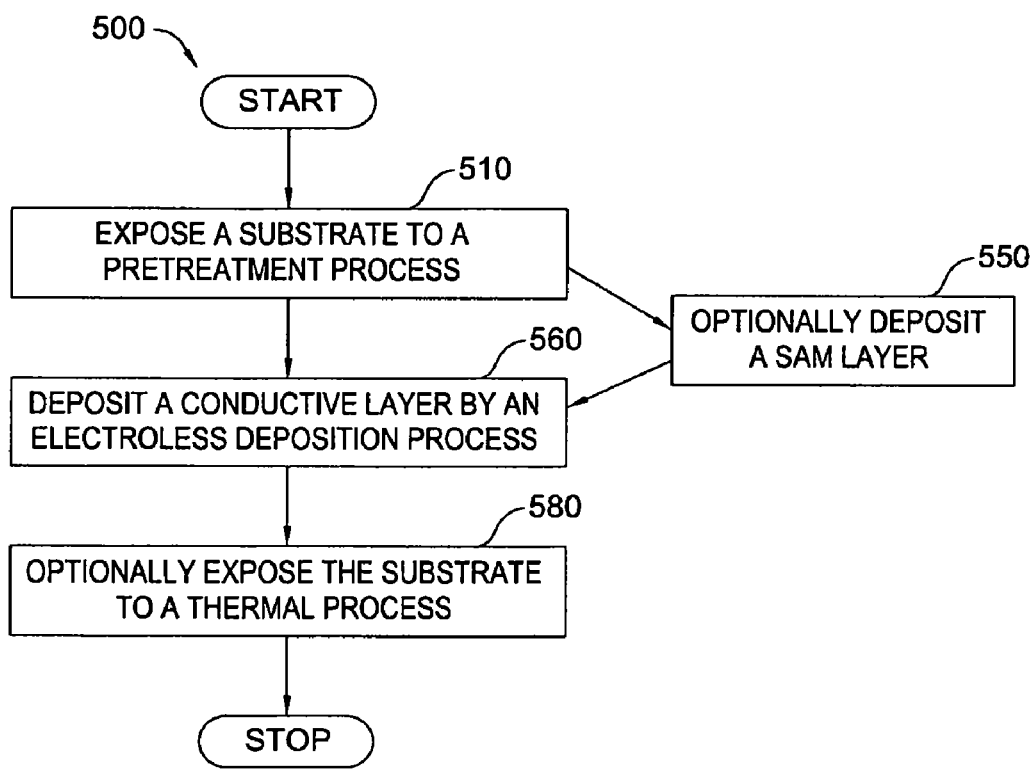
FIG. 5 illustrates a flow chart depicting a process sequence as described within embodiments herein.
Figure 6:
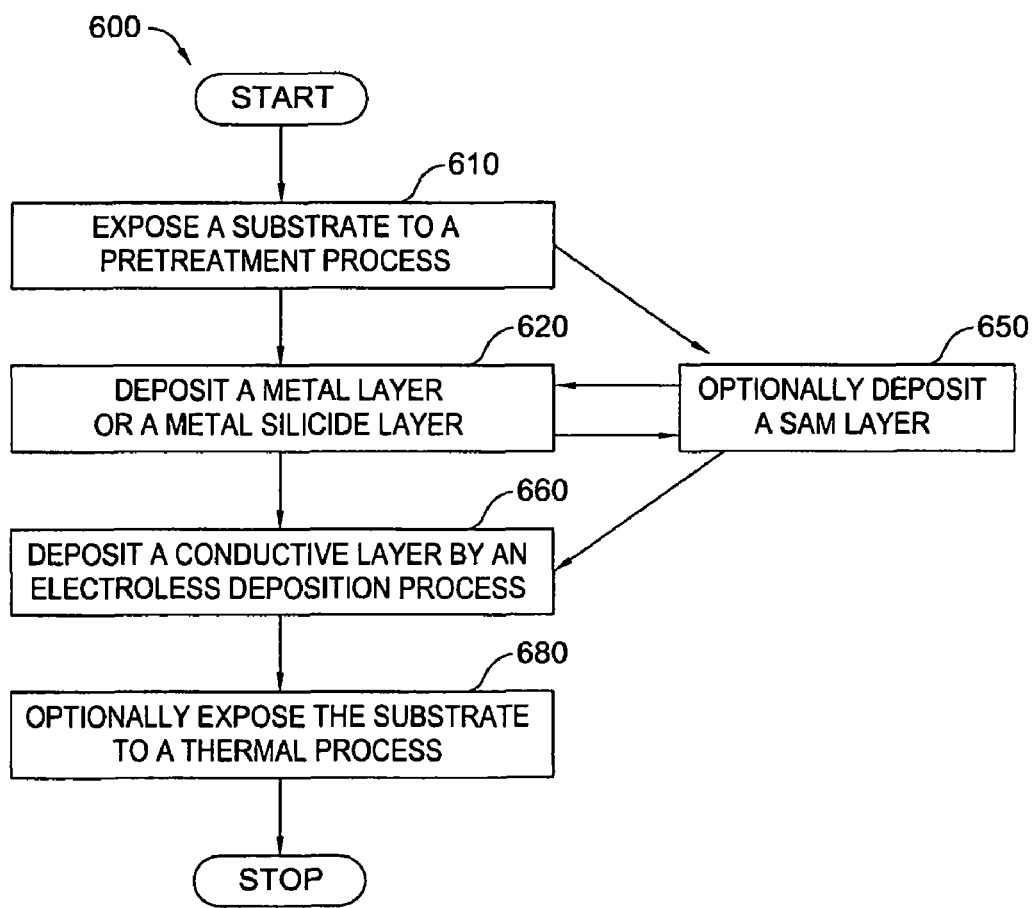
FIG. 6 illustrates a flow chart depicting another process sequence as described within embodiments herein.
Figure 7:
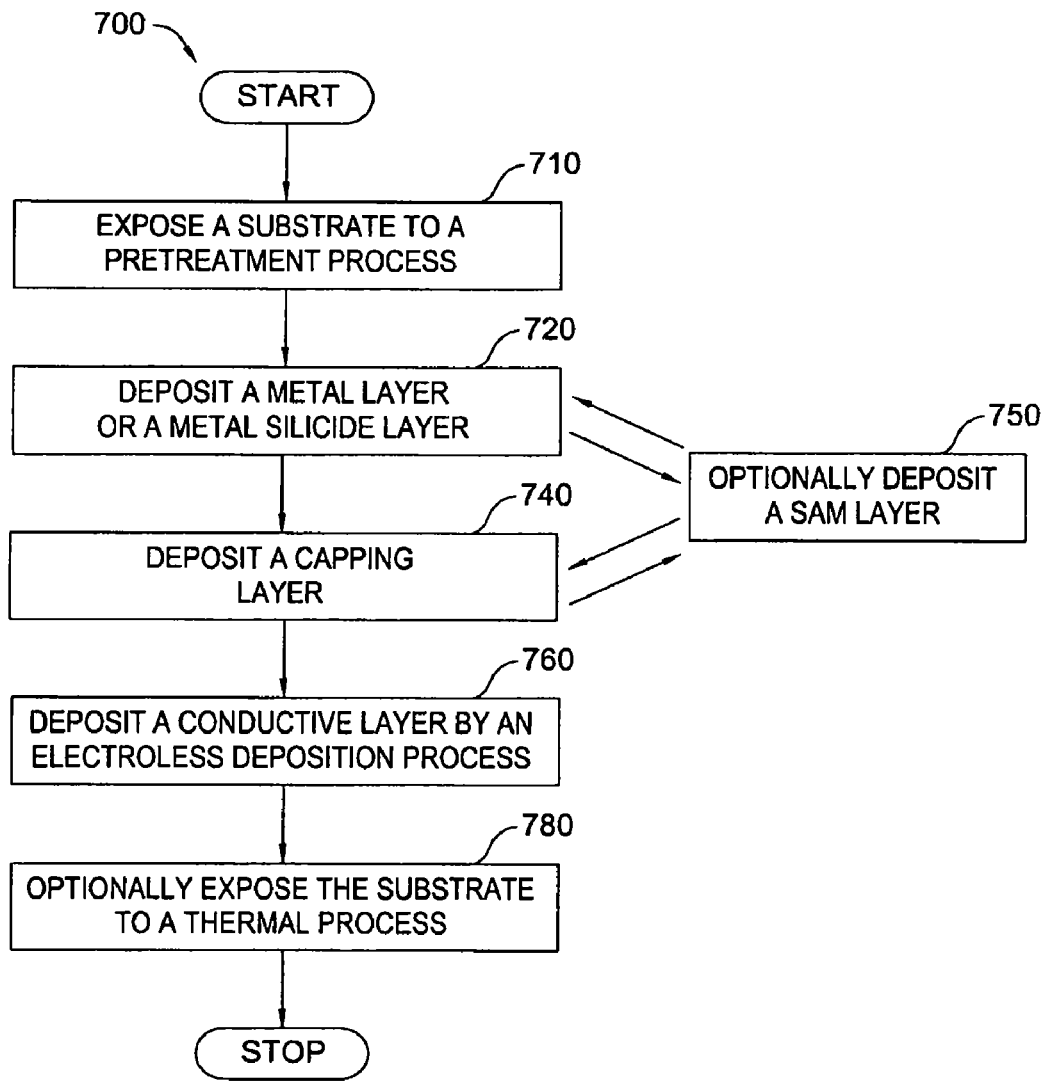
FIG. 7 illustrates a flow chart depicting another process sequence as described within embodiments herein.

FIGS. 3A-3Q and 4A-4H illustrate cross-sectional views of electronic devices disposed on substrates 300 and 400 at different stages of interconnect fabrication sequences incorporating multiple embodiments herein. FIGS. 5-7 provide flow charts of processes 500, 600, and 700 that may be used to form substrates 300 and 400 while correlating with FIGS. 3A-3Q and 4A-4H. Processes 500, 600, and 700 may be used during interconnect fabrication where an exposed contact surface contains either a silicon surface or a silicide surface on substrates 300 and 400.

FIG. 3A illustrates a cross-sectional view of substrate 300 having contact aperture 310 formed within dielectric layer 304. Dielectric layer 304 contains an insulating material that may include silicon dioxide and other silicon oxides, silicon on insulator (SOI), silicon oxynitride, fluorine-doped silicate glass (FSG), or carbon-doped silicon oxides, such as $SiO_xC_y$, for example, BLACK DIAMOND® low-k dielectric, available from Applied Materials, Inc., located in Santa Clara, Calif. Contact aperture 310 may be formed in dielectric layer 304 using conventional lithography and etching techniques to expose interconnect layer 302, such as a bit line layer. Alternatively, dielectric layer 304 may be deposited on interconnect layer 302 forming contact aperture 310 therein. Interconnect layer 302 may contain pure silicon or a silicon-containing material that contains germanium, carbon, boron, phosphorous, arsenic, metals, or combinations thereof, among other dopants. For example, interconnect layer 302 may contain silicon, silicon carbide, silicon germanium, silicon germanium carbide, metal silicide, doped variants thereof, or combinations thereof. In one example, interconnect layer 302 is a MOS type source or a drain interface and is generally a doped (e.g., n+ or p+) silicon region of substrate 300.

Oxide surface 312 is usually formed upon the oxidation of interconnect layer 302 during an exposure to air subsequent to etching and ashing processes used forming contact aperture 310. Oxide surface 312 may be a continuous layer or a discontinuous layer across the surface of interconnect layer 302 and include a surface terminations of oxygen, hydrogen, hydroxide, halide, metals, or combinations thereof. Oxide surface 312 may also contain various contaminants, such as organic and inorganic residues and particulate. Oxide surface 312 formed on interconnect layer 302 generally contains a metastable lower quality oxide (e.g., $SiO_x$, where x is between 0 and 2) compared to the much more stable oxide materials that are typically used to form dielectric layer 304 (e.g., $SiO_2$), such as thermal oxides. The metastable lower quality oxide (e.g., the "native oxide") is much easier to remove from interconnect layer 302 than dielectric layer 304, probably due to a lower activation energy than the material of dielectric layer 304.

FIG. 3B illustrates substrate 300 containing exposed surface 314 on interconnect layer 302 subsequent to the removal of oxide surface 312. Exposed surface 314 may be formed by at least one pretreatment process during steps 510, 610, or 710 of processes 500, 600, or 700, as described by embodiments herein. In some embodiments, exposed surface 314 may contain an exposed silicon contact surface. In other embodiments, exposed surface 314 may contain an exposed silicide contact surface.

During steps 510, 610, or 710, substrate 300 may be exposed to at least one pretreatment process, such as a preclean process, an activation process, or combinations thereof for forming exposed surface 314. A preclean process may be used to remove oxide surface 312 and reveal a silicon surface or a silicide surface of exposed surface 314. In one embodiment, the preclean process may be a wet clean process, such as a buffered oxide etch (BOE) process, a SC1 process, a SC2 process, or a HF-last process. Alternatively, the preclean process may be a dry clean process, such as a plasma etch process. For example, a plasma etch process that may be used during a preclean process is the SICONI™ preclean process, available from Applied Materials, Inc., located in Santa Clara, Calif. Pretreatment processes, such as a preclean process and an activation process for forming exposed surface 314, are further described below.

An activation process may also be used as a pretreatment process to form exposed surface 314. In one embodiment, substrate 300 is exposed to an activation solution containing a cobalt source, a fluoride source, and a hypophosphite source to transform oxide surface 312 to a metal silicide surface of exposed surface 314. In another embodiment, substrate 300 is exposed to an activation solution containing a variable-valence metal reducing agent that chemically reduces oxide surface 312 to a silicon surface of exposed surface 314. In another embodiment, substrate 300 is exposed to reducing hydrogen plasma that chemically reduces oxide surface 312 to a silicon surface of exposed surface 314.

In one embodiment, FIGS. 3B-3C illustrate substrate 300 before and after contact aperture 310 is filled with metal contact material 320, during steps 560, 660, or 760 of processes 500, 600, or 700 (FIGS. 5-7), as described by embodiments herein. Metal contact material 320 may be deposited on exposed surface 314 of interconnect layer 302 within contact aperture 310. Metal contact material 320 is usually deposited on exposed surface 314 during an electroless deposition process to bottom-up fill contact aperture 310. In one example, the electroless deposition process is continued until aperture 310 is filled with metal contact material 320.

Alternatively, a second electroless deposition process, or multiple deposition processes, may be used to form metal contact material 320 while filling contact aperture 310. For example, metal contact material 320 may be formed of different materials to vary the composition throughout, such as a graded material. In an alternative embodiment, cobalt-nickel stack material 330 is formed of at least two types of materials sequentially deposited on each other, such as layers 322 and 324, as illustrated in FIGS. 4A and 4B by substrate 400 that correlates to substrate 300 in FIGS. 3C and 3D. In one example, layer 322 may contain a cobalt material and layer 324 may contain a nickel material. In another example, layer 322 may contain a nickel material and layer 324 may contain a cobalt material.

Metal contact material 320 may be formed or deposited during electroless deposition process described herein. The composition of metal contact material 320 may vary based on the particular electronic device requirements. Metal contact material may contain metallic nickel, nickel phosphide, nickel boride, nickel phosphide boride, metallic cobalt, cobalt phosphide, cobalt boride, cobalt phosphide boride, cobalt tungsten, cobalt tungsten phosphide, cobalt tungsten boride, cobalt tungsten phosphide boride, cobalt nickel, cobalt nickel phosphide, cobalt nickel boride, cobalt nickel phosphide boride, silicides thereof, derivatives thereof, alloys thereof, or combinations thereof. Electroless deposition processes and solutions for forming or depositing metal contact material 320 and cobalt-nickel stack material 330, are further described below.

FIG. 3D illustrates silicide layer 315 at the interface of exposed surface 314 and metal contact material 320. Silicide layer 315 may be formed by exposing substrate 300 to an optional thermal process during steps 580, 680, or 780. Silicide layer 315 may contain a cobalt silicide, nickel silicide, cobalt tungsten silicide, cobalt nickel silicide, borides thereof, alloys thereof, derivatives thereof, or combinations thereof. Silicide layer 315 may be formed prior, during, or after filling of aperture 310 with metal contact material 320. In one example, substrate 300 is heated during a thermal process to form silicide layer from silicon atoms of exposed surface 314 and metal atoms of metal contact material 320. Generally, substrate 300 may be heated to a temperature within a range from about 150° C. to about 500° C. for a time period within a range from about 5 seconds to about 10 minutes.

In another embodiment, FIGS. 3B and 3E-3G illustrate substrate 300 at different stages of process 500. SAM-layer 350 may be formed on substrate 300 during optional step 550, as depicted in FIG. 3E. SAM-layer 350 may be initially deposited over dielectric layer 304 and exposed surface 314. In one example, SAM-layer 350 is deposited on exposed surface 314 containing an exposed contact silicon surface. In another example, SAM-layer 350 is deposited on exposed surface 314 containing an exposed contact silicide surface.

FIGS. 3E-3F illustrate substrate 300 before and after contact aperture 310 is filled with metal contact material 320, during step 560 of process 500 (FIG. 5). Metal contact material 320 is deposited on SAM-layer 350 within contact aperture 310. Metal contact material 320 is with interconnect layer 302. In one example, substrate 300 may be exposed to a thermal process to form silicide layer 315 (FIG. 3G). Silicide layer 315 provides higher electrical conductivity, than without silicide layer 315, at the interface between interconnect layer 302 and metal contact material 320. In an alternative embodiment, cobalt-nickel stack material 330 may be formed on SAM-layer 350, as illustrated in FIG. 4C by substrate 400 that correlates to substrate 300 in FIG. 3G. Deposition processes for depositing SAM-layer 350 on substrate 300 are further described below.

FIG. 6 depicts a flow graph of process 600 containing steps 610, 650, 660, and 680 that correlate to steps 510, 550, 560, and 580 of process 500. However, process 600 further provides the formation or deposition of a silicide material during step 620. In one embodiment of process 500, a silicide material may be formed during a pretreatment process at step 510. For example, substrate 300 may be exposed to a clean process to remove oxides and contaminants and subsequently exposed to an activation process to form a silicide material.

FIG. 3H depicts substrate 300 containing metal-containing layer 316 disposed on interconnect layer 302 within contact aperture 310. Metal-containing layer 316 may contain a metal, a metal silicide, or an alloy thereof. Metal-containing layer 316 may be formed or deposited during steps 510, 610, 620, 710, or 720 and include a metal layer or a metal silicide layer. In one example, metal-containing layer 316 contains a metallic layer and is deposited on exposed surface 314 containing an exposed contact silicon surface. Thereafter, exposed surface 314 and metal-containing layer 316 form a metal silicide during a thermal process. In another example, metal-containing layer 316 contains a metal silicide material deposited or formed on exposed surface 314. In another example, metal-containing layer 316 contains a metal silicide material formed either prior to or during steps 620 or 720.

In one embodiment, metal-containing layer 316 contains a cobalt material, such as metallic cobalt, cobalt silicide, cobalt phosphide, cobalt boride, cobalt phosphide boride, cobalt tungsten, cobalt tungsten phosphide, cobalt tungsten boride, cobalt tungsten phosphide boride, a cobalt alloy, silicides thereof, or combinations thereof. In another embodiment, metal-containing layer 316 contains a cobalt nickel material, such as cobalt nickel, cobalt nickel phosphide, cobalt nickel boride, derivatives thereof, alloys thereof, or combinations thereof. In another embodiment, metal-containing layer 316 contains a nickel material, such as metallic nickel, nickel silicide, nickel phosphide, nickel boride, nickel phosphide boride, a nickel alloy, or combinations thereof. In other embodiments, the exposed silicide contact surface may be metal-containing layer 316 that contains at least one metal, such as cobalt, nickel, tungsten, molybdenum, rhenium, titanium, tantalum, hafnium, zirconium, alloys thereof, or combinations thereof.

In one embodiment, metal-containing layer 316 may be formed by exposing substrate 300 to an activation solution during an electroless deposition process. In one example, metal-containing layer 316 may be formed by exposing substrate 300 to an activation process. In another example, metal-containing layer 316 may be formed by exposing substrate 300 to a thermal process. In another example, metal-containing layer 316 may be formed by exposing substrate 300 to a silicidation process.

FIGS. 3H-3I illustrate substrate 300 before and after contact aperture 310 is filled with metal contact material 320, during step 660 of process 600 (FIG. 6). Metal contact material 320 is deposited on metal-containing layer 316 within contact aperture 310. In an alternative embodiment, cobalt-nickel stack material 330 may be formed on metal-containing layer 316, as illustrated in FIG. 4D by substrate 400 that correlates to substrate 300 in FIG. 3I. Deposition processes for depositing metal-containing layer 316 on substrate 300 are further described below.

In another embodiment, FIGS. 3H and 3J illustrate substrate 300 at different stages of process 600. SAM-layer 350 may be formed on substrate 300 during optional step 650, as depicted in FIG. 3J. SAM-layer 350 may be initially deposited over dielectric layer 304 and metal-containing layer 316. In one example, SAM-layer 350 is deposited on metal-containing layer 316 containing a metallic surface. In another example, SAM-layer 350 is deposited on metal-containing layer 316 containing a metal silicide surface.

FIGS. 3J-3K illustrate substrate 300 before and after contact aperture 310 is filled with metal contact material 320, during step 660 of process 600. Metal contact material 320 may be deposited on SAM-layer 350 within contact aperture 310. In an alternative embodiment, cobalt-nickel stack material 330 may be formed on SAM-layer 350, as illustrated in FIG. 4E by substrate 400 that correlates to substrate 300 in FIG. 3K.

FIG. 7 depicts a flow graph of process 700 containing steps 710, 720, 750, 760, and 780 that correlate to steps 610, 620, 650, 660, and 680 of process 600. However, process 700 further provides the deposition of capping layer 318 during step 740. In one embodiment, capping layer 318 may be deposited on substrate 300 as a barrier layer over metal-containing layer 316, during step 740 of process 700. In one example, capping layer 318 may be deposited on SAM-layer 350 covering metal-containing layer 316 within contact aperture 310 (FIG. 3L). Thereafter, metal contact material 320 may be deposited on capping layer 318 filling contact aperture 310 (FIG. 3M). In an alternative embodiment, cobalt-nickel stack material 330 may be formed on capping layer 318, as illustrated in FIG. 4F by substrate 400 that correlates to substrate 300 in FIG. 3M.

In another example, capping layer 318 may be deposited directly on metal-containing layer 316 within contact aperture 310 (FIG. 3N). Thereafter, in one aspect, metal contact material 320 may be deposited on capping layer 318 filling contact aperture 310 (FIG. 3O). In an alternative embodiment, cobalt-nickel stack material 330 may be formed on capping layer 318, as illustrated in FIG. 4G by substrate 400 that correlates to substrate 300 in FIG. 3O. In another aspect, SAM-layer 350 may be deposited on capping layer 318 (FIG. 3P). Subsequently, metal contact material 320 may be deposited on SAM-layer 350 covering capping layer 318 and filling contact aperture 310 (FIG. 3Q). In alternative embodiments, cobalt-nickel stack material 330 may be formed on SAM-layer 350 covering capping layer 318, as illustrated in FIG. 4H by substrate 400 that correlates to substrate 300 in FIG. 3O. Deposition processes, including electroless deposition processes and solutions for depositing capping layer 318 on substrate 300, are further described below.

Pretreatment Processes
Wet Clean Processes

In one embodiment, substrate 300 may be exposed to a wet clean process to remove oxide surface 312 and to form exposed surface 314 during steps 510, 610, or 710 of processes 500, 600, or 700. Substrate 300 may be treated by wet clean processes, such as an acidic cleaning process (e.g., a solution containing hydrochloric acid and hydrogen peroxide held at elevated temperature, such as SC2 clean), a basic cleaning process (e.g., a solution containing ammonium hydroxide and hydrogen peroxide held at elevated temperature, such as SC1 clean), or a series of wet cleans containing both acidic and basic cleaning processes. In a preferred embodiment, substrate 300 is exposed to a SC1 solution (e.g., TMAH and $H_2O_2$) to remove organic residues and other contaminants and subsequently, exposed to a BOE solution (e.g., 0.5 M of TEA-HF solution) to remove native oxides.

A wet clean process may include dispensing a wet clean solution across or sprayed on the surface of substrate 300. The wet clean process may be an in situ process performed in the same processing cell as a subsequent electroless deposition process. Alternatively, substrate 300 may be wet cleaned in a separate processing cell from the subsequent electroless deposition processing cell. A wet-clean pretreatment process may occur for about 10 minutes or less, such as within a range from about 5 seconds to about 5 minutes, preferably, from about 5 seconds to about 3 minutes, more preferably, from about 10 seconds to about 2 minutes, and more preferably, from about 15 seconds to about 1 minute. During the pretreatment process, the substrate is maintained at a temperature within a range from about 15° C. to about 50° C., preferably, about room temperature (e.g., 20° C.). The wet-clean process may be performed in a TEMPEST® wet-clean system, available from Applied Materials, Inc., located in Santa Clara, Calif. Other examples of various wet-clean processes that may be used to remove oxide surface 312 are further described in commonly assigned U.S. Ser. No. 60/709,564 (APPM 9916105), filed Aug. 19, 2005, U.S. Ser. No. 60/703,538 (APPM 9916103), filed Jul. 29, 2005, and U.S. Ser. No. 60/663,493 (APPM 9916L), filed Mar. 18, 2005, which are all incorporated by reference herein in their entirety.

In one embodiment, oxide surface 312 is removed by a HF-last solution to form exposed surface 314 as a substantially oxide-free, silicon hydride surface. In one example, the wet-clean process utilizes an HF-last solution containing water, HF and optional additives including chelators, surfactants, reductants, other acids or combinations thereof. In one example, the hydrogen fluoride concentration of a wet-clean solution may be within a range from about 10 ppm to about 5 wt %, preferably, from about 50 ppm to about 2 wt %, and more preferably, from about 100 to about 1 wt %, for example, about 0.5 wt %. In another embodiment, oxide surface 312 is removed during a liquid reduction process to form exposed surface 314 as a substantially oxide-free, silicon-containing surface.

SC1 and SC2 Processes

In one embodiment, substrate 300 containing oxide surface 312 may be exposed to a SC1 clean solution to remove contaminants, such as organic and inorganic residues and particulates during steps 510, 610, or 710 of processes 500, 600, or 700. In one example, the SC1 clean solution contains hydrogen peroxide and at least one basic compound, such as ammonium hydroxide, tetramethylammonium hydroxide, ethanolamine, diethanolamine, triethanolamine, derivatives thereof, salts thereof, or combinations thereof. The substrate may be heated to a temperature within a range from about 50° C. to about 100° C., preferably, from about 70° C. to about 90° C.

In another embodiment, substrate 300 containing oxide surface 312 may be exposed to a SC2 clean solution during steps 510, 610, or 710 of processes 500, 600, or 700. In one example, the SC2 clean solution contains hydrogen peroxide and hydrogen chloride. The substrate may be heated to a temperature within a range from about 50° C. to about 100° C., preferably, from about 70° C. to about 90° C.

BOE Processes and Solutions

In another embodiment of a preclean process, buffered oxide etch (BOE) solutions and processes may be used to selectively remove native oxides and other contaminants from substrate 300 during steps 510, 610, or 710 of processes 500, 600, or 700. The BOE solutions generally contain alkanolamine compounds and an etchant, such as hydrogen fluoride. In one embodiment, the viscosity of the BOE solution may be adjusted by varying a concentration ratio of at least two alkanolamine compounds. A BOE solution having a viscosity within a range from about 10 cP to about 30 cP has superior wetting properties on a substrate surface during a process to selectively remove native oxide layers therefrom.

In one embodiment, a method for selectively removing oxide surface 312 to form exposed surface 314 on substrate 300. In one example, substrate 300 may be exposed to a BOE solution containing about 0.5 M of TEA-HF solution for about 25 seconds at about 20° C. In another example, substrate 300 may be exposed to a BOE solution containing about 0.5 M of EA-HF solution for about 20 seconds at about 20° C. In another example, substrate 300 may be exposed to a BOE solution containing about 0.5 M of DEA-HF solution for about 30 seconds at about 20° C. Thereafter, the excess BOE solution is removed by spinning the substrate for about 10 seconds.

In one embodiment, a composition of a BOE solution is provided which includes, by weight, a first alkanolamine compound at a concentration within a range from about 0.5% to about 10%, a second alkanolamine compound at a concentration within a range from about 0.5% to about 10%, hydrogen fluoride at a concentration within a range from about 0.5% to about 10%, water at a concentration within a range from about 80% to about 98%, a pH value within a range from about 3.5 to about 5, and a viscosity within a range from about 10 cP to about 30 cP.

In one example, the first alkanolamine compound is at a concentration within a range from about 1% to about 5%, the second alkanolamine compound is at a concentration within a range from about 1% to about 5%, the hydrogen fluoride is at a concentration within a range from about 1% to about 5%, the water is at a concentration within a range from about 85% to about 95%, the pH value is within a range from about 3.8 to about 4.8, and the viscosity is within a range from about 12 cP to about 28 cP. In another example, the first alkanolamine compound is at a concentration within a range from about 2% to about 3%, the second alkanolamine compound is at a concentration within a range from about 2% to about 3%, the hydrogen fluoride is at a concentration within a range from about 1% to about 3%, the water is at a concentration within a range from about 88% to about 94%, the pH value is within a range from about 3.5 to about 5, preferably, from about 4 to about 4.5, and the viscosity is less than about 50 cP, such as within a range from about 15 cP to about 25 cP. In another example, the first alkanolamine compound is at a concentration of about 3%, the second alkanolamine compound is at a concentration of about 2%, the hydrogen fluoride is at a concentration of about 2%, the water is at a concentration of about 92%, the pH value is within a range from about 4 to about 4.5, and the viscosity is less than about 50 cP, such as within a range from about 15 cP to about 25 cP.

In some examples, a weight ratio of the first alkanolamine compound to the second alkanolamine compound is within a range from about 1 to about 5, for example, about 1.5, or about 1.1. The first and second alkanolamine compounds may be different alkanolamine compounds selected from ethanolamine (EA), diethanolamine (DEA), triethanolamine (TEA), or derivatives thereof. For example, the first alkanolamine compound may be DEA and the second alkanolamine compound may be TEA. In another example, the first alkanolamine compound is DEA the second alkanolamine compound is EA. In another example, the first alkanolamine compound is TEA the second alkanolamine compound is EA. In other examples, the first alkanolamine compound is DEA at a concentration to have the viscosity within a range from about 15 cP to about 25 cP or at a concentration by weight within a range from about 1% to about 15%.

A BOE solution may contain a first alkanolamine and a second alkanolamine compound at a weight ratio concentration to form a viscosity within a range from about 10 cP to about 30 cP, hydrogen fluoride at a concentration by weight within a range from about 0.5% to about 10%, water at a concentration by weight within a range from about 80% to about 98%, a pH value within a range from about 3.5 to about 5, and a viscosity within a range from about 10 cP to about 30 cP. The first and second alkanolamine compounds may include EA, DEA, TEA, or other alkanolamine derivatives. In one example, the weight ratio concentration of the first alkanolamine compound to the second alkanolamine compound is within a range from about 1 to about 5, such as about 1.5 or about 1.1. In another example, the viscosity of the BOE solution is within a range from about 12 cP to about 28 cP, preferably, from about 15 cP to about 25 cP.

The BOE solution may contain a pH adjusting agent, such as hydrofluoric acid, additional alkanolamine compounds, sulfuric acid, ammonium hydroxide, tetramethylammonium hydroxide, derivatives thereof, or combinations thereof. In one example, the BOE solution contains the pH adjusting agent at a concentration to have a pH value within a range from about 3.5 to about 5, preferably, from about 3.8 to about 4.8, and more preferably, from about 4 to about 4.5.

In one example, the buffered oxide etch solution contains a first alkanolamine compound at a concentration by weight within a range from about 0.5% to about 10%, a second alkanolamine compound at a concentration by weight within a range from about 0.5% to about 10%, hydrogen fluoride at a concentration by weight within a range from about 0.5% to about 10%, water at a concentration by weight within a range from about 80% to about 98%, a pH value within a range from about 3.5 to about 5, and a viscosity within a range from about 10 cP to about 30 cP.

In another embodiment, a composition of a BOE solution is provided which includes DEA at a concentration by weight within a range from about 0.5% to about 10%, TEA at a concentration by weight within a range from about 0.5% to about 10%, HF at a concentration by weight within a range from about 0.5% to about 10%, water at a concentration by weight within a range from about 80% to about 98%, a pH value within a range from about 3.5 to about 5 and a viscosity within a range from about 10 cP to about 30 cP.

In one example, the composition of the buffered oxide etch solution contains the DEA at a concentration within a range from about 1% to about 5%, the TEA at a concentration within a range from about 1% to about 5%, the HF at a concentration within a range from about 1% to about 5%, the water at a concentration within a range from about 85% to about 95%, the pH value within a range from about 3.8 to about 4.8, and the viscosity within a range from about 12 cP to about 28 cP. In another example, the composition of the buffered oxide etch solution contains the DEA at a concentration within a range from about 2% to about 3%, the TEA is at a concentration within a range from about 2% to about 3%, the HF is at a concentration within a range from about 1% to about 3%, the water is at a concentration within a range from about 88% to about 94%, the pH value is within a range from about 4 to about 4.5, and the viscosity is within a range from about 15 cP to about 25 cP. In another example, the composition of the buffered oxide etch solution contains the DEA is at a concentration of about 3%, the TEA is at a concentration of about 2%, the HF is at a concentration of about 2%, the water is at a concentration of about 92%, the pH value is within a range from about 4 to about 4.5, and the viscosity is within a range from about 15 cP to about 25 cP. The weight ratio of the DEA to the TEA is within a range from about 1 to about 5, preferably, the weight ratio is about 1.5 or less and the viscosity is about 23 cP.

In another embodiment, a method for selectively removing an oxide layer from a substrate surface is provided which includes providing a substrate having a native oxide surface and a feature surface and exposing the substrate to a buffered oxide etch solution to remove the native oxide surface while forming a native surface and preserving the feature surface on the substrate. The BOE solution may contain DEA at a concentration by weight within a range from about 0.5% to about 10%, TEA at a concentration by weight within a range from about 0.5% to about 10%, HF at a concentration by weight within a range from about 0.5% to about 10%, water at a concentration by weight within a range from about 80% to about 98%, a pH value within a range from about 3.5 to about 5, and a viscosity within a range from about 10 cP to about 30 cP. The pH value of the BOE solution may be adjusted to a point of zero charge of silicon, such as within a range from about 4 to about 4.5. The BOE solution may have a weight ratio of the DEA to the TEA within a range from about 1 to about 5. In one example of the BOE solution, the weight ratio is about 1.5 and the viscosity is about 23 cP.

The method further provides that substrate 300 is exposed to the BOE solution for a time period within a range from about 10 seconds to about 120 seconds, preferably, from about 15 seconds to about 60 seconds, for example, about 30 seconds. Substrate 300 may be exposed to a rinse solution subsequent to the BOE solution. Thereafter, a metal-containing material, such as a barrier layer or a metal silicide layer, may be deposited or formed on the native surface.

A wet clean solution may contain hydrogen fluoride and at least one basic compound, such as ammonium hydroxide, tetramethylammonium hydroxide, EA, DEA, TEA, derivatives thereof, salts thereof, or combinations thereof. Examples of the wet clean solution include an EA-HF complex, a DEA-HF complex, a TEA-HF complex, a DEA-EA-HF complex, a DEA-TEA-HF complex, a TEA-EA-HF complex, derivatives thereof, salts thereof, or combinations thereof. In one example, substrate 300 is exposed to a BOE solution containing about 0.5 M of TEA-HF solution for about 25 seconds at about 20° C. Thereafter, the excess BOE solution is removed by spinning the substrate for about 10 seconds.

Plasma Etch Process

In another embodiment, substrate 300 is exposed to a plasma etch process or a plasma clean process remove oxide surface 312 and to form exposed surface 314 during steps 510, 610, or 710 of processes 500, 600, or 700. Also, the plasma etch process may be used to remove native oxides and other contaminants formed on exposed contact surfaces prior to several processes described herein, such as an electroless deposition process. Surfaces exposed to the plasma etch process usually have an improve adhesion of subsequently deposited metal layers. The plasma etch process is performed in a chamber adapted to perform a chemical etch clean and in-situ anneal on substrates.

An exemplary plasma etch process for removing native oxides on a surface of the substrate using an ammonia ($NH_3$) and nitrogen trifluoride ($NF_3$) gas mixture performed within a plasma etch processing chamber will now be described. The plasma etch process begins by placing a substrate into a plasma etch processing chamber. During processing, the substrate may be cooled below 65° C., such as between 15° C. and 50° C. In another example, the substrate is maintained at a temperature of between 22° C. and 40° C. Typically, the substrate support is maintained below about 22° C. to reach the desired substrate temperatures.

The ammonia gas and nitrogen trifluoride gas are introduced into the dry etching chamber to form a cleaning gas mixture. The amount of each gas introduced into the chamber is variable and may be adjusted to accommodate, for example, the thickness of the oxide layer to be removed, the geometry of the substrate being cleaned, the volume capacity of the plasma and the volume capacity of the chamber body. In one aspect, the gases are added to provide a gas mixture having at least a 1:1 molar ratio of ammonia to nitrogen trifluoride. In another aspect, the molar ratio of the gas mixture is at least about 3 to about 1 (ammonia to nitrogen trifluoride). Preferably, the gases are introduced in the dry etching chamber at a molar ratio of from about 1:1 (ammonia to nitrogen trifluoride) to about 30:1, more preferably, from about 5:1 (ammonia to nitrogen trifluoride) to about 30:1. More preferably, the molar ratio of the gas mixture is of from about 5 to 1 (ammonia to nitrogen trifluoride) to about 10 to about 1. The molar ratio of the gas mixture may also fall between about 10:1 (ammonia to nitrogen trifluoride) and about 20:1. Alternatively, a pre-mixed gas mixture of the preferred molar ratio may be used during the plasma etch process.

A purge gas or carrier gas may also be added to the gas mixture. Any suitable purge/carrier gas may be used, such as argon, helium, hydrogen, nitrogen, forming gas, or mixtures thereof. Typically, the overall gas mixture by volume of ammonia and nitrogen trifluoride is within a range from about 0.05% to about 20%. The remainder of the process gas may be the carrier gas. In one embodiment, the purge or carrier gas is first introduced into the chamber body before the reactive gases to stabilize the pressure within the chamber body.

The operating pressure within the chamber body can be variable. The pressure may be maintained within a range from about 500 mTorr to about 30 Torr, preferably, from about 1 Torr to about 10 Torr, and more preferably, from about 3 Torr to about 6 Torr. An RF power within a range from about 5 watts to about 600 watts may be applied to ignite a plasma of the gas mixture within the plasma cavity. Preferably, the RF power is less than about 100 watts. More preferable is that the frequency at which the power is applied is very low, such as less than about 100 kHz, and more preferably, within a range from about 50 kHz to about 90 kHz.

The plasma energy dissociates the ammonia and nitrogen trifluoride gases into reactive species that combine to form a highly reactive ammonia fluoride ($NH_4F$) compound and/or ammonium hydrogen fluoride ($NH_4F$—$HF$) which reacts with the substrate surface. In one embodiment, the carrier gas is first introduced into the dry etch chamber, a plasma of the carrier gas is generated, and then the reactive gases, ammonia and nitrogen trifluoride, are added to the plasma.

Not wishing to be bound by theory, it is believed that the etchant gas, $NH_4F$ and/or $NH_4F$—$HF$, reacts with the native oxide surface to form ammonium hexafluorosilicate ($(NH_4)_2SiF_6$), ammonia, and water. The ammonia and water are vapors at processing conditions and removed from the chamber by a vacuum pump attached to the chamber. A thin film of ammonium hexafluorosilicate is left behind on the substrate surface.

The thin film of ammonium hexafluorosilicate on the substrate surface may be removed during a vacuum sublimation process. The process chamber radiates heat to dissociate or sublimate the thin film of ammonium hexafluorosilicate into volatile $SiF_4$, $NH_3$, and $HF$ products. These volatile products are then removed from the chamber by the vacuum pump attached to the system. In one example, a temperature of about 75° C. or higher is used to effectively sublimate and remove the thin film from the substrate. Preferably, a temperature of about 100° C. or more is used, such as between about 115° C. and about 200° C. Once the film has been removed from the substrate, the chamber is purged and evacuated prior to removing the cleaned substrate.

A plasma cleaning processes may be performed using a vacuum preclean chamber, such as a SICONI™ Preclean chamber and process, both available from Applied Materials, Inc., located in Santa Clara, Calif. Further description of a plasma-assisted dry etch chamber and plasma etch process that may be used by embodiment herein is disclosed in commonly assigned U.S. Ser. No. 11/063,645, (8802), entitled "In-Situ Dry Clean Chamber For Front End Of Line Fabrication," filed on Feb. 22, 2005, and U.S. Ser. No. 11/192,993, (8707.P1), entitled "Integrated Electroless Deposition System," filed on Jul. 29, 2005, which are hereby incorporated by reference in their entirety to the extent not inconsistent with the claimed invention.

Activation Processes

In other embodiments, substrate 300 may be exposed to an activation process to remove oxide surface 312 and to form exposed surface 314, silicide layer 315, or metal-containing layer 316, or combinations thereof during steps 510, 610, or 710 of processes 500, 600, or 700. In one embodiment, interconnect layer 302 contains exposed surface 314 has an exposed silicon contact surface within contact aperture 310. Exposed surface 314 may contain a pure silicon surface, a silicon hydride-terminus surface, or a mixture thereof. In another embodiment, interconnect layer 302 contains exposed surface 314 has an exposed silicide contact surface within contact aperture 310. The exposed silicide contact surface contains a silicide surface, such as a cobalt silicide, a nickel silicide, a cobalt nickel silicide, a cobalt tungsten silicide, alloys thereof, or combinations thereof. As described by embodiments herein, exposed surface 314 containing an exposed silicide contact surface, silicide layer 315, or metal-containing layer 316 may contain at least one metal silicide material that contains cobalt, nickel, tungsten, molybdenum, rhenium, titanium, tantalum, hafnium, zirconium, alloys thereof, or combinations thereof.

In another embodiment, the activation process may be a liquid reduction process, whereas oxide surface 312 is exposed to a reducing solution to form exposed surface 314 during steps 510, 610, or 710 of processes 500, 600, or 700. The reducing solutions may contain at least one metal-reductant, such as a compound containing a variable-valence metal. Variable-valence metals are utilized as metal-reductants due to the availability of electrons between redox states and include compounds of $Ti^{3+}/Ti^{4+}$, $Fe^{2+}/Fe^{3+}$, $Cr^{2+}/Cr^{3+}$ and $Sn^{2+}/Sn^{4+}$. Metal-reductants containing variable-valence metals may contain a variety of anionic ligands including complexing agents and halides, such as chlorides, fluorides, bromides or iodides. Complexing agents that are useful may have functional groups that include carboxylic acids, dicarboxylic acids, polycarboxylic acids, amino acids, amines, diamines, polyamines, alkylamines, alkanolamines and alkoxyamines. Complexing agents may include citric acid, glycine, ethylenediamine (EDA), monoethanolamine, diethanolamine (DEA), triethanolamine (TEA), derivatives thereof, salts thereof or combinations thereof. In one embodiment, citric acid or a citrate salt is a preferred complexing agent within a reducing solution. For example, a reducing solution may contain titanium salts with carboxylic acid ligands, such as a citrate.

Generally, the reducing solutions are formed in water by combining a metal halide (e.g., titanium chloride containing $TiCl_3$ and $TiCl_4$) with a salt containing a predetermined ligand (e.g., trisodium citrate) to form a metal complex or a metal salt that contains the predetermined ligand (e.g., titanium citrate) having a variable-valence state. The reducing solution may further contain additives such as various chelators, surfactants, pH adjusting agents, or combinations thereof. Variable-valence metal compounds and reducing solutions are further described in V. V. Sviridov et al., "Use of Ti(III) Complexes to reduce Ni, Co, and Fe in Water Solution," J. Phys. Chem., vol. 100, pp. 19632-19635, (1996), M. Majima et al., "Development of Titanium Redox Electroless Plating Method," SEI Technical Review, vol. 54, pp. 67-70, (June 2002), S, Nakao et al., "Electroless Pure Nickel Plating Process with Continuous Electrolytic Regeneration System," Surface and Coatings Technology, vols. 169-170(1), pp. 132-134, (Jun. 2, 2003), which are each incorporated by reference to the extent not inconsistent with the claimed aspects and description herein.

In an effort to remove oxide surface 312, substrate 300 is exposed to a reducing solution for a predetermined time to remove the oxides from exposed surface 314. The liquid reduction process may occur for about 5 minutes or less, preferably within a range from about 1 second to about 120 seconds, more preferably, from about 5 seconds to about 90 seconds. During the liquid reduction process, the substrate is heated to a temperature within a range from about 20° C. to about 150° C., preferably, from about 50° C. to about 100° C. In one example, the metal-reductant may be a $Ti^{3+}$ compound, such as titanium citrate. In an alternative embodiment of a pretreatment process, substrate 300 is exposed to a plasma process for a predetermined time to reduce oxide surface 312 and form exposed surface 314.

In another embodiment, the pretreatment process may be a vapor deposition process, whereas oxide surface 312 is exposed to a reducing vapor to form exposed surface 314 during steps 510, 610, or 710 of processes 500, 600, or 700. The reductant may include borane, diborane, borane-alkyl-sulfides, such as borane-dimethylsulfide ($BH_3 \cdot (CH_3)_2 S$), alkyboranes (e.g., ethylborane), phosphine, alkylposphines (e.g., dimethylphosphine), silane, disilane, trisilane, alkylsilanes (e.g., methylsilane), ammonia, hydrazine, hydrogen, derivatives thereof or combinations thereof. Preferably, the reductant is diborane, phosphine, silane, hydrazine, hydrogen, or combinations thereof.

Cobalt Activation Process and Solution

In other embodiments, the activation process may be a silicidation process, whereas exposed surface 314 is exposed to an action solution to form metal-containing layer 316 during steps 510, 610, 620, 710, or 720 of processes 500, 600, or 700. In one embodiment, an activation solution to form metal-containing layer 316 containing a cobalt silicide material on substrate 300 contains a cobalt source, a fluoride source, and a hypophosphite source. Useful cobalt sources include cobalt sulfate, cobalt chloride, cobalt fluoride, cobalt acetate, cobalt phosphate, other $Co^{2+}$ compounds, derivatives thereof, hydrates thereof or combinations thereof. In one example, cobalt sulfate heptahydrate ($CoSO_4 \cdot 7H_2O$) is used within the activation solution to form cobalt-containing materials. The activation solution may have a cobalt source at a concentration within a range from about 1 mM to about 500 mM, preferably, from about 1 mM to about 100 mM, more preferably, from about 5 mM to about 50 mM, and more preferably, from about 10 mM to about 30 mM, for example, about 22 mM.

The activation solution further contains a fluoride source. Useful fluoride sources include hydrogen fluoride, ammonium fluoride compounds, including alkylammonium fluoride compounds and metal fluoride compounds, including alkaline fluoride compounds, rare-earth fluoride compounds, transition metal fluoride compounds, or combinations thereof. Ammonium fluoride compounds, alkylammonium fluoride compounds, and alkanolamine fluoride compounds may have a chemical formula of $[R_4N][F]$, wherein each R is independently a hydrogen (H), an alkyl group, such as methyl ($-CH_3$ or Me), ethyl ($-C_2H_5$ or Et), propyl ($-C_3H_7$ or Pr), butyl ($-C_4H_9$ or Bu), amyl ($-C_5H_{11}$), an alcohol group, such as methanol ($-CH_2OH$), ethanol ($-C_2H_2OH$), propanol ($-C_3H_6OH$), butanol ($-C_4H_8OH$), pentanol ($-C_5H_{10}OH$), derivatives thereof, or combinations thereof. The activation solution may have a fluoride concentration within a range from about 1 mM to about 1 M, preferably, from about 10 mM to about 400 mM, more preferably, from about 20 mM to about 200 mM, and more preferably, from about 50 mM to about 120 mM, for example, about 83 mM.

In one embodiment, a fluoride source includes an alkanolamine fluoride compound with a chemical formula of $[(HO(CH_2)_n)_m NH_{4-m}][F]$, wherein n=1, 2, 3, 4, or 5 and m=1, 2, 3, or 4, for example, an ethanolammonium fluoride has a chemical formula $[(HOCH_2CH_2)_m NH_{4-m}][F]$. In one example, a fluoride source is a monoalkanolamine fluoride compound with a chemical formula of $[(HO(CH_2)_n)NH_3][F]$, wherein n=1, 2, 3, 4, or 5, for example, ethanolammonium fluoride (EA-HF) with a chemical formula of $[(HOCH_2CH_2)NH_3][F]$. In another example, a fluoride source is a dialkanolamine fluoride compound with a chemical formula of $[(HO(CH_2)_n)_2 NH_2][F]$, wherein n=1, 2, 3, 4, or 5, for example, diethanolammonium fluoride (DEA-HF) with a chemical formula of $[(HOCH_2CH_2)_2 NH_2][F]$. In another example, a fluoride source is a trialkanolamine fluoride compound with a chemical formula of $[(HO(CH_2)_n)_3 NH][F]$, wherein n=1, 2, 3, 4, or 5, for example, triethanolammonium fluoride (TEA-HF) with a chemical formula of $[(HOCH_2CH_2)_3 NH][F]$. In other examples, the fluoride sources include ammonium fluoride ($[H_4N][F]$) and tetramethylammonium fluoride ($[Me_4N][F]$). The fluoride compounds may be added as a fluoride salt or may be formed to the activation solution. In one embodiment, a fluoride source may be formed in situ by combining a basic compound to an acidic compound, such as combining diethanolamine (DEA) and hydrogen fluoride (HF) to form diethanolammonium fluoride (DEA-HF). Therefore, the activation solution may contain a fluoride compound and also a complexing base to form the respective fluoride salt. The base, such as ammonia, alkylamine compounds, alkanolamine compounds, or mixtures thereof, may be contained in the activation solution at a concentration within a range from about 1 mM to about 1 M, preferably, from about 10 mM to about 400 mM, more preferably, from about 20 mM to about 200 mM, and more preferably, from about 50 mM to about 120 mM, for example, about 80 mM.

In another embodiment, the activation solution may contain two, three or more different alkanolamine fluoride compounds, alkanolamine compounds, other fluoride sources, hydrogen fluoride, salts thereof, or mixtures thereof. The viscosity of the activation solution may be adjusted by varying a concentration ratio of at least two alkanolamine compounds. An activation solution having a viscosity within a range from about 10 cP to about 30 cP has superior wetting properties while activating a substrate surface. In one example, a molar ratio of the first alkanolamine compound to the second alkanolamine compound is within a range from about 1 to about 5, preferably, from about 1 to about 1.5, for example, about 1.2. The first and second alkanolamine compounds may be different alkanolamine compounds selected from ethanolamine (EA), diethanolamine (DEA), triethanolamine (TEA), or derivatives thereof. For example, the first alkanolamine compound may be DEA and the second alkanolamine compound may be TEA. In another example, the first alkanolamine compound is DEA the second alkanolamine compound is EA. In another example, the first alkanolamine compound is TEA the second alkanolamine compound is EA.

An activation solution further contains a reductant, such as a hypophosphite source. Useful hypophosphite sources include sodium hypophosphite, potassium hypophosphite, lithium hypophosphite, calcium hypophosphite, ammonium hypophosphite, tetramethylammonium (TMAH) hypophosphite and other alkylammonium hypophosphites, derivatives thereof, or combinations thereof. Hypophosphite of sodium, potassium, ammonium, or alkylammonium may have the chemical formula of $M_nH_{3-n}PO_2$, where n=1, 2, or 3 and M is sodium, potassium ammonium, alkylammonium (e.g., TMAH), derivatives thereof, or combinations thereof. In one example, a preferred hypophosphite source is TMAH hypophosphite or sodium hypophosphite. The activation solution may have a hypophosphite concentration within a range from about 1 mM to about 1 M, preferably, from about 10 mM to about 400 mM, more preferably, from about 20 mM to about 200 mM, and more preferably, from about 50 mM to about 120 mM, for example, about 83 mM.

In one embodiment, a cobalt activation solution may be used to form metal-containing layer 316. In one example, the activation solution may contain a cobalt concentration within a range from about 1 mM to about 100 mM, a fluoride concentration within a range from about 10 mM to about 400 mM, and a hypophosphite concentration within a range from about 5 mM to about 150 mM. Preferably, an activation solution may contain a cobalt concentration within a range from about 5 mM to about 50 mM, a fluoride concentration within a range from about 20 mM to about 200 mM, and a hypophosphite concentration within a range from about 10 mM to about 80 mM. More preferably, an activation solution may contain a cobalt concentration within a range from about 10 mM to about 30 mM, a fluoride concentration within a range from about 50 mM to about 120 mM, and a hypophosphite concentration within a range from about 20 mM to about 60 mM. In one example, an activation solution contains a cobalt concentration of about 22 mM, a fluoride concentration of about 83 mM, and a hypophosphite concentration of about 43 mM.

In one example, an activation solution has a pH value of about 7 and contains about 22 mM of a cobalt sulfate hexahydrate, about 70 mM of DEA-HF, about 18 mM of HF, and about 43 mM of a TMAH-hypophosphite. In another example, an activation solution has a pH value of about 7 and contains about 22 mM of a cobalt sulfate hexahydrate, about 70 mM of TEA-HF, about 18 mM of HF, and about 43 mM of a TMAH-hypophosphite. In another example, an activation solution has a pH value of about 7 and contains about 22 mM of a cobalt sulfate hexahydrate, about 70 mM of DEA-TEA-HF (DEA:TEA molar ratio of 1.22), about 18 mM of HF, and about 43 mM of a TMAH-hypophosphite.

Generally, the substrate may be exposed to an activation solution to form a cobalt silicide layer for a time period within a range from about 1 second to about 90 seconds, preferably, from about 5 seconds to about 60 seconds, and more preferably, from about 10 seconds to about 30 seconds, for example, about 20 seconds. The substrate may be heated to a temperature within a range from about 70° C. to about 95° C., preferably, from about 80° C. to about 85° C. during the activation process.

Self Assembled Monolayer and Capping Layer
Self Assembled Monolayer

In one embodiment, SAM-layer 350 (self-assembled-monolayer) may be deposited on substrate 300 to provide further barrier protection between neighboring layers during steps 550, 650, or 750 of processes 500, 600, or 700. An example of a prototypical SAM material includes, but is not limited to, aminopropyltriethoxy silane (APTES). A vapor deposition process may be used to form SAM-layer 350 from APTES. Further description of a process for depositing a SAM material is disclosed in commonly assigned U.S. Ser. No. 60/754,230, filed Dec. 27, 2005, (9916L.06), which is herein incorporated by reference in its entirety.

Substrate 300 may be exposed to a plasma treatment process prior to depositing SAM-layer 350, as described in embodiments herein, such as during optional step 750 of process 700 (FIG. 7). A plasma treatment process containing water, hydrogen, or combinations thereof forms a silanol (e.g., Si—OH) terminated surface for promoting strong adhesion of SAM-layer 350 to an underlying layer, such as dielectric layer 304, exposed surface 314, silicide layer 315, metal-containing layer 316, capping layer 318, and other surfaces and layers on substrate 300.

In one embodiment, SAM-layer 350 may be deposited on substrate 300 covering exposed surface 314 and dielectric layer 304 (FIG. 3E). Metal contact material 320 is formed over SAM-layer 350 (FIG. 3F). Subsequently, substrate 300 is exposed to a thermal process and silicide layer 315 is formed at the interface between metal contact material 320 and interconnect layer 302 (FIG. 3G). The portion of SAM-layer 350 therebetween is decomposed and may incorporate carbon into silicide layer 315.

In another embodiment, SAM-layer 350 may be deposited on substrate 300 covering metal-containing layer 316 and dielectric layer 304 (FIG. 3J). In one example, metal contact material 320 is directly formed over SAM-layer 350 (FIG. 3K). In another example, capping layer 318 is formed over SAM-layer 350 prior to the deposition of metal contact material 320 (FIG. 3L-3M). The portion of SAM-layer 350 formed at the interface between metal contact material 320 and metal-containing layer 316 may be preserved (FIG. 3K), but usually is decomposed and incorporates carbon into nearby layers, such as metal-containing layer 316 (FIG. 3M). The composition of SAM-layer 350, the composition of neighboring layers, and the subsequent process temperatures experienced by substrate 300 determine the extent the durability or decomposition of SAM-layer 350.

In another embodiment, SAM-layer 350 may be deposited on substrate 300 covering capping layer 318 and dielectric layer 304 (FIG. 3P) and metal contact material 320 is directly formed over SAM-layer 350 (FIG. 3Q).

Capping Layer

Capping layer 318 may be formed or deposited on substrate 300, as described in embodiments herein, such as during step 740 of process 700 (FIG. 7). In one embodiment, a selective deposition process may be used to form or deposit capping layer 318 over the exposed areas of metal-containing layer 316 (FIGS. 3L-3Q). The selective deposition process may include an electroless deposition process, a CVD process, a PE-CVD process, an ALD process, a PE-ALD process, a PVD process, or combinations thereof. The selective process covers metal-containing layer 316 while maintaining sidewalls of contact aperture 310 free of deposited material. Capping layer 318, as a barrier layer, eliminates or reduces atomic diffusion (e.g., silicon) into metal contact materials 320 from metals or metal silicides contained within metal-containing layer 316.

In one example, capping layer 318 may be selectively deposited by use of an electroless deposition process. The electroless deposition process may be used to form a layer that contains a binary alloy, a ternary alloy, or a quaternary alloy. Capping layer 318 may contain cobalt boride (CoB), cobalt phosphide (CoP), nickel boride (NiB), nickel phosphide (NiP), cobalt tungsten phosphide (CoWP), cobalt tungsten boride (CoWB), nickel tungsten phosphide (NiWP), nickel tungsten boride (NiWB), cobalt molybdenum phosphide (CoMoP), cobalt molybdenum boride (CoMoB), nickel molybdenum phosphide (NiMoB), nickel molybdenum phosphide (NiMoP), nickel rhenium phosphide (NiReP), nickel rhenium boride (NiReB), cobalt rhenium boride (CoReB), cobalt rhenium phosphide (CoReP), alloys thereof, derivatives thereof, or combinations thereof. The film composition of the binary or ternary alloys can be preferably designed to have a resistivity within a range from about 1 $\mu\Omega$-cm to about 200 $\mu\Omega$-cm.

Capping layer 318 containing a cobalt-tungsten alloy or a nickel-containing material may be deposited during an electroless deposition process that utilizes either a pre-mixed solution or solution prepared by an in-line mixing process that combines componential solutions. In one example, an electroless solution to deposit a cobalt-tungsten alloy may contain a cobalt source, a tungsten source, a citrate source, a hypophosphite source, a borane reductant, and other additives. In another example, an electroless solution to deposit a nickel-containing material may contain a nickel source, a citrate source, a borane reductant and other complexing agents and additives. Other electroless deposition solutions and processes useful for depositing cobalt-tungsten alloys are further described in the commonly assigned U.S. Ser. No. 10/967,919, entitled, "Selective Self-initiating Electroless Capping of Copper with Cobalt-containing Alloys," filed on Oct. 18, 2004, and published as US 2005-0136193, which is incorporated by reference to the extent not inconsistent with the claimed aspects and description herein.

Sequential Electroless Deposition Processes for Co—Ni Stack Material

In embodiment described herein, FIGS. 4A-4H depict substrate 400 having contact aperture 310 filled with cobalt-nickel stack material 330 during steps 560, 660, or 760 of processes 500, 600, or 700. Cobalt-nickel stack material 330 may be formed during a bottom-up electroless deposition process. Cobalt-nickel stack material 330 may be formed by a sequential electroless deposition process containing at least two electroless solutions, such as a cobalt solution containing a cobalt source and a nickel solution containing a nickel source. Cobalt-nickel stack material 330 is formed of sequential layers of at least two types of materials, layers 322 and 324, wherein layers 322 may contain a cobalt material and layers 324 may contain a nickel material or vice versa. Cobalt materials and nickel materials contained within cobalt-nickel stack material 330 may contain cobalt, nickel, tungsten, boron or phosphorus and include materials such as metallic cobalt, cobalt boride, cobalt phosphide, cobalt borophosphide, metallic nickel, nickel boride, cobalt tungsten boride, nickel phosphide, nickel borophosphide, nickel tungsten boride, derivatives thereof, alloys thereof, or combinations thereof.

In one example, cobalt-nickel stack material 330 on substrate 400 (FIG. 4A) may be formed during a sequential electroless deposition process, instead of forming metal contact material 320 on substrate 300 (FIG. 3C). Similarly, by substituting a non-sequential electroless deposition process for the sequential electroless deposition process, a variety of alternative features may be formed on substrate 400. In another example, cobalt-nickel stack material 330 on substrate 400 (FIG. 4B) may be formed during a sequential electroless deposition process, instead of forming metal contact material 320 on substrate 300 (FIG. 3D). Other examples include substituting metal contact material 320 on substrate 300 for cobalt-nickel stack material 330 on substrate 400, where FIG. 4C correlates to FIG. 3G, FIG. 4D correlates to FIG. 3I, FIG. 4E correlates to FIG. 3K, FIG. 4F correlates to FIG. 3M, FIG. 4G correlates to FIG. 3O, and FIG. 4H correlates to FIG. 3Q. In one example, cobalt-nickel stack material 330 may be a graded contact plug by forming layers 322 and 324 closer to interconnect layer 302 with a different composition than layers 322 and 324 that are further away from interconnect layer 302.

Figure 8:
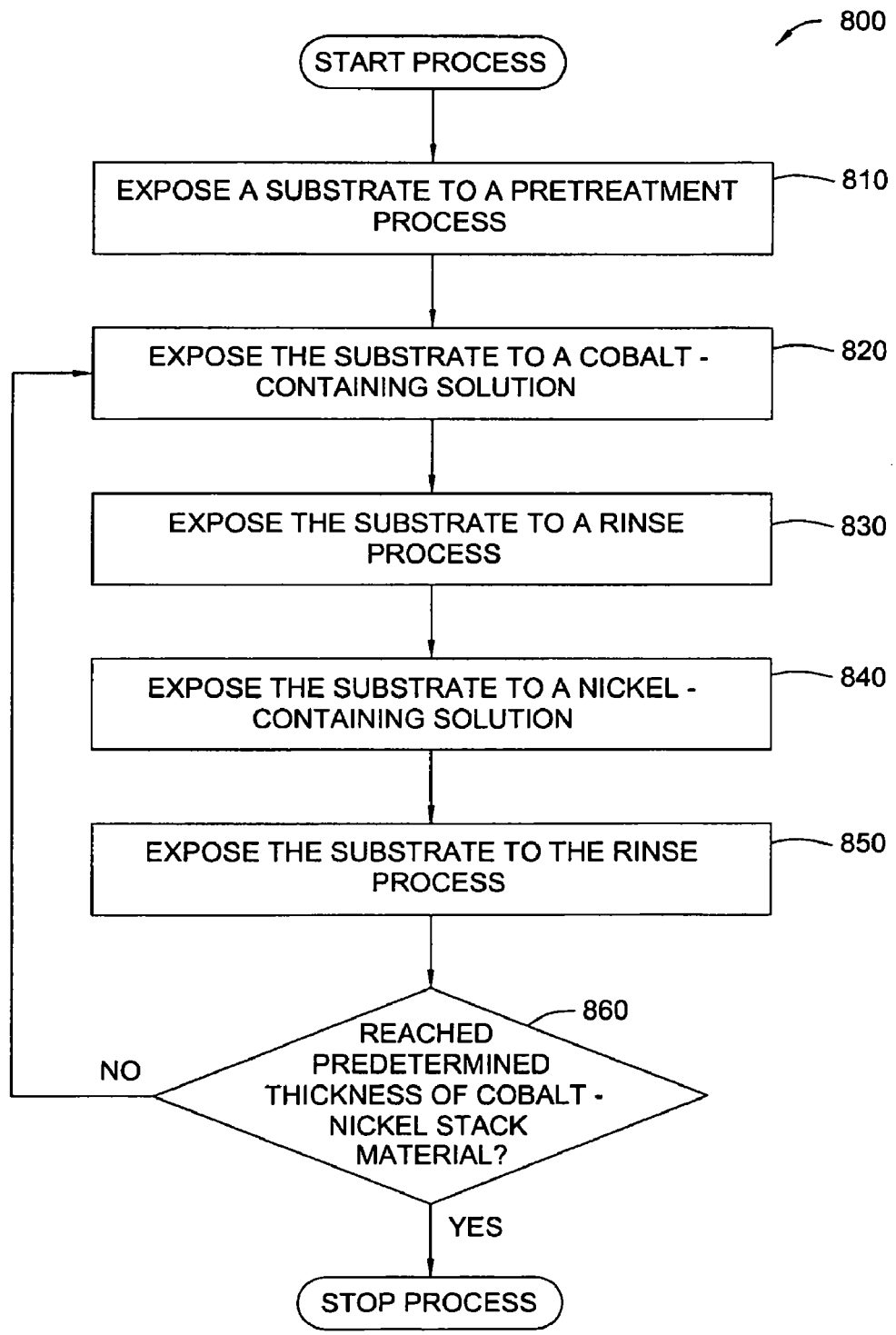
FIG. 8 illustrates a flow chart depicting an electroless deposition process as described within embodiments herein.

Sequential electroless deposition processes contain a variety of sequences for exposing a substrate to deposition solutions and rinse solutions. FIG. 8 illustrates a flow chart of process 800 describing one embodiment of a sequential electroless deposition process. During optional step 810, a substrate may be exposed to a pretreatment process as described herein to remove oxide surfaces, form hydride surfaces, form metallic surfaces, form silicide surfaces, form a SAM material, form a capping layer, by pre-clean processes, activation processes, reduction processes, or combinations thereof.

Figure 9A:
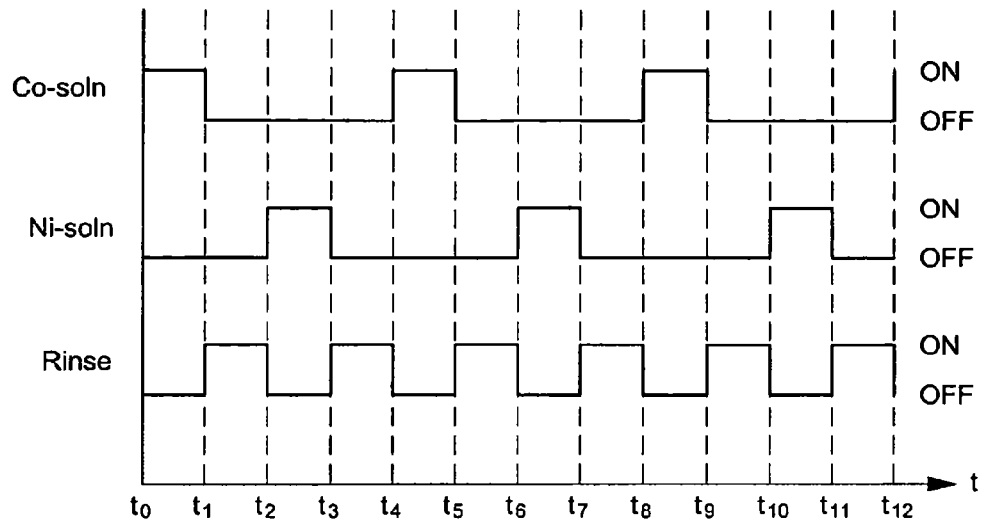
FIGS. 9A-9D illustrate a schematic representation of timing sequences for electroless deposition processes as described within embodiments herein.

FIG. 9A depicts a graph to illustrate periods of time for exposing a substrate to solutions during an electroless process, such as process 800. During step 820, a cobalt material is formed by exposing the substrate to a cobalt solution containing a cobalt source for a time period between $t_0$ and $t_1$. Generally, the cobalt material is deposited to form a layer with a thickness within a range from about a discontinuous atomic layer to about 100 Å, preferably, from about an atomic layer to about 50 Å, and more preferably, from about 5 Å to about 30 Å. The time period between $t_0$ and $t_1$ may be within a range from about 5 seconds to about 5 minutes, preferably, from about 10 seconds to about 3 minutes, and more preferably, from about 30 seconds to about 2 minutes.

The substrate is exposed to a rinse solution during a rinse process for a time period between $t_1$ and $t_2$ during step 830. The rinse solution is preferably water, such as deionized water. Alternatively, the rinse solution may contain an additive, such as a surfactant, a chelator or a mild reductant. The rinse process removes the remaining cobalt solution and any byproducts. Generally, the time period between $t_1$ and $t_2$ is within a range from about 5 seconds to about 5 minutes, preferably, from about 10 seconds to about 3 minutes, and more preferably, from about 30 seconds to about 2 minutes.

During step 840, a nickel material is formed by exposing the substrate to a nickel solution containing a nickel source for a time period between $t_2$ and $t_3$. Generally, the nickel material is deposited to form a layer with a thickness within a range from about a discontinuous atomic layer to about 100 Å, preferably, from about an atomic layer to about 50 Å, and more preferably, from about 5 Å to about 30 Å. The time period between $t_2$ and $t_3$ may be within a range from about 5 seconds to about 5 minutes, preferably, from about 10 seconds to about 3 minutes, and more preferably, from about 30 seconds to about 2 minutes.

The substrate is again exposed to the rinse solution during a rinse process for a time period between $t_3$ and $t_4$ during step 850. The rinse solution may be the same solution as used during step 830 or the rinse solution may be different, dependant on the specific chemistries of the cobalt and nickel solutions. The rinse process removes the remaining nickel solution and any byproducts. Generally, the time period between $t_3$ and $t_4$ is within a range from about 5 seconds to about 5 minutes, preferably, from about 10 seconds to about 3 minutes, and more preferably, from about 30 seconds to about 2 minutes.

Once the cobalt-nickel material is deposited to a predetermined thickness, the sequential electroless process is complete at step 860. However, multiple cycles of steps 820, 830, 840, and 850 may be repeated until the cobalt-nickel material is formed with the predetermined thickness. For example, a second cycle of steps 820, 830, 840, and 850 may be completed during $t_4$-$t_8$ and a third cycle of steps 820, 830, 840, and 850 may be completed during $t_8$-$t_{12}$ (FIG. 9A). Usually, the cobalt-nickel material is deposited onto the substrate to fill any vias or apertures.

In other aspects, process 800 may be modified by rearranging or omitting process steps. For example, step 820 may include a nickel solution and not a cobalt solution while step 840 includes a cobalt solution and not a nickel solution. In another example, steps 820 or 840 may by skipped during a cycle. In an alternative embodiment, multiple layers of cobalt material may be deposited on each other or multiple layers of nickel material may be deposited on each other. A graded cobalt-nickel material may be formed by selectively manipulating the order or the amount of time of process steps 820, 830, 840, and 850.

Therefore, in an alternative embodiment, in reference to FIGS. 4A-4H, the composition of layers 322 and 324 may vary throughout cobalt-nickel stack material 330, such as that layers 322 and 324 that are closer to interconnect layer 302 have a different composition than layers 322 and 324 that are further away from interconnect layer 302 (FIGS. 4A-4H). Electroless deposition processes that may be utilized to control composition of cobalt-nickel materials formed during processes described herein (e.g., processes 800 and 1000) are further disclosed in commonly assigned U.S. Ser. No. 11/040, 962, entitled "Method and Apparatus for Selectively Changing Thin Film Composition During Electroless Deposition in a Single Chamber," filed on Jan. 22, 2005, and published as US 2005-0181226, which is incorporated by reference to the extent not inconsistent with the claimed aspects and description herein.

Figure 9B:
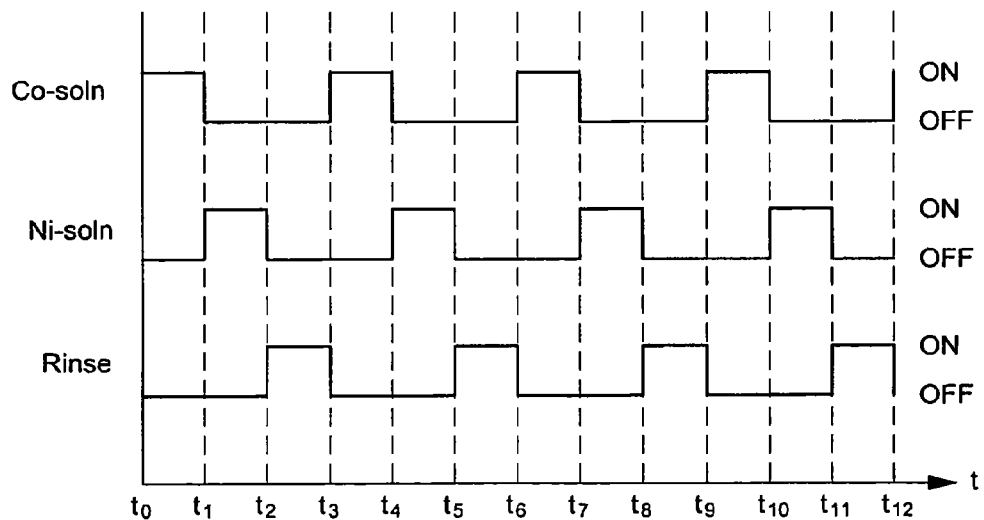
Figure 9C:
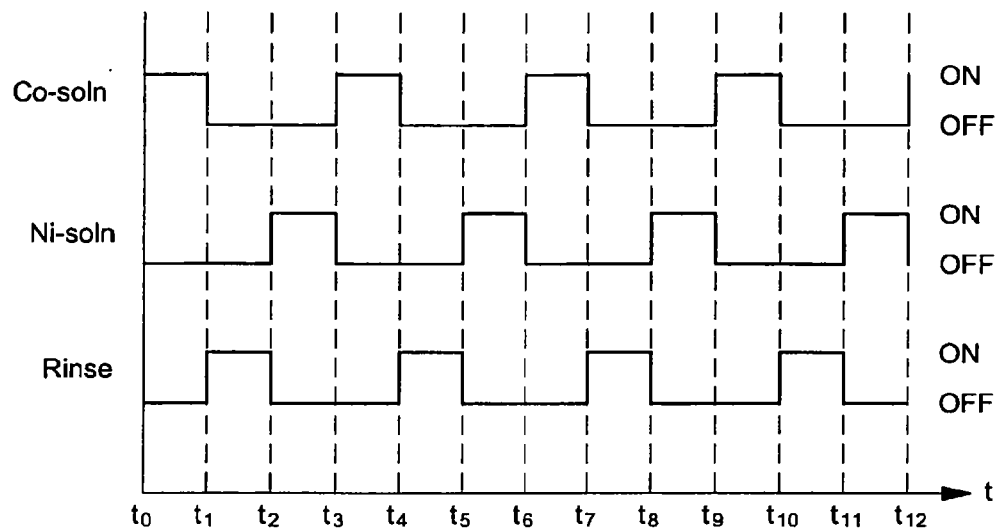
Figure 9D:
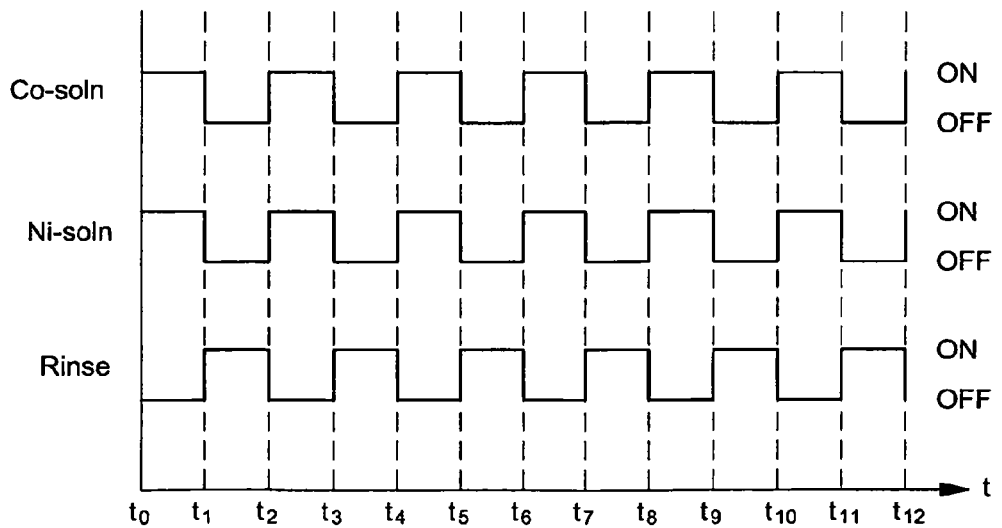

FIGS. 9B-9D depict graphs to illustrate periods of time for exposing a substrate to solutions during various permutations of the electroless deposition processes. Process 800 may be modified by omitting step 830 (FIG. 9B), by omitting step 850 (FIG. 9C), or conducting steps 820 and 840 during the same time and omitting either step 830 or step 850 (FIG. 9D).

Figure 10:
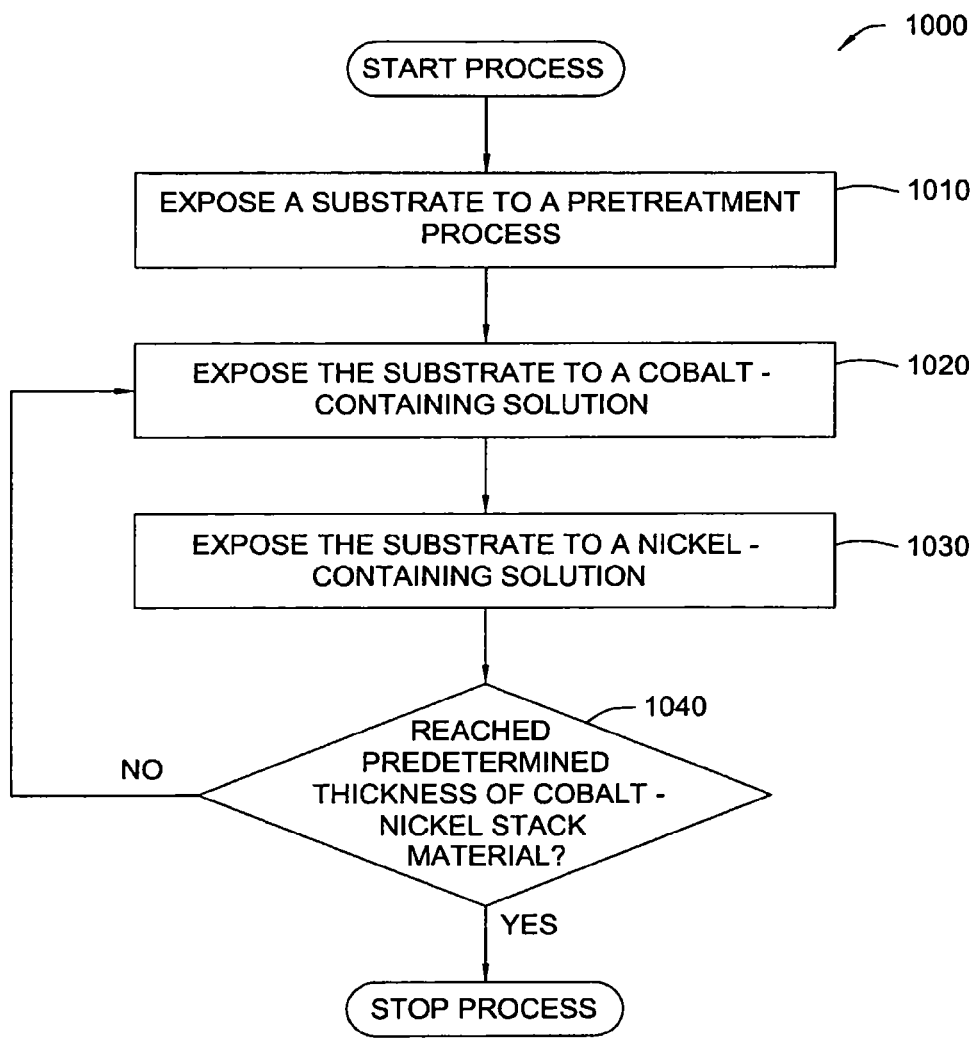
FIG. 10 illustrates a flow chart depicting an electroless deposition process as described within embodiments herein.
Figure 11:
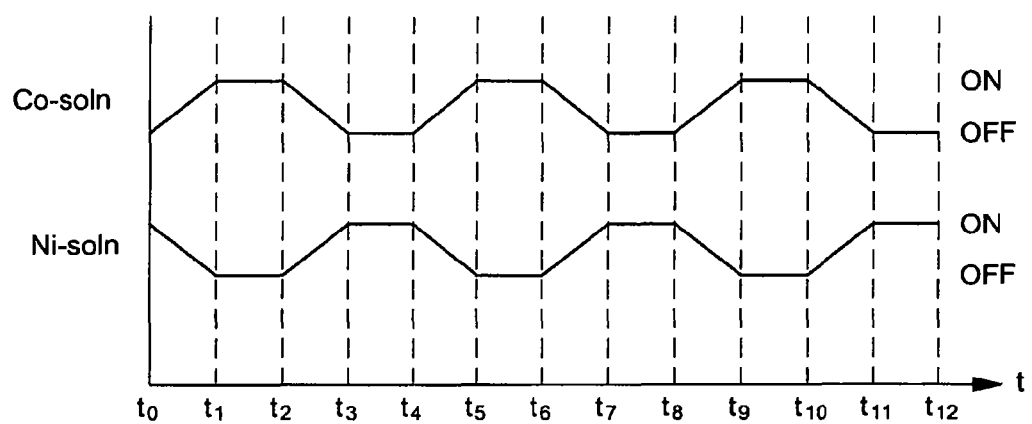
FIG. 11 illustrates a schematic representation of an alternative timing sequence for an electroless deposition process as described within an embodiment herein.

FIG. 10 illustrates a flow chart of process 1000 describing another embodiment of a sequential electroless deposition process, and FIG. 11 depicts a graph to illustrate periods of time for exposing a substrate to solutions during an electroless deposition process, such as process 1000. During optional step 1010, a substrate may be exposed to a pretreatment process and/or activation process as described for step 810.

A cobalt-nickel material may be formed by exposing a substrate to an increasing amount of a cobalt solution while exposing the substrate to a decreasing amount of a nickel solution for a time period between $t_0$ and $t_1$ during a transition step. The cobalt-nickel material is deposited to form a layer with a thickness within a range from about a discontinuous atomic layer to about 100 Å, preferably, from about an atomic layer to about 50 Å, and more preferably, from about 5 Å to about 30 Å. The time period between $t_0$ and $t_1$ may be within a range from about 5 seconds to about 5 minutes, preferably, from about 10 seconds to about 3 minutes, and more preferably, from about 30 seconds to about 2 minutes.

During step 1020, a cobalt material is formed by exposing the substrate to a cobalt solution for a time period between $t_1$ and $t_2$. The cobalt material is deposited to form a layer with a thickness within a range from about a discontinuous atomic layer to about 100 Å, preferably, from about an atomic layer to about 50 Å, and more preferably, from about 5 Å to about 30 Å. The time period between $t_1$ and $t_2$ may be within a range from about 5 seconds to about 5 minutes, preferably, from about 10 seconds to about 3 minutes, and more preferably, from about 30 seconds to about 2 minutes.

A cobalt-nickel material may be formed by exposing the substrate to a decreasing amount of a cobalt solution while exposing the substrate to an increasing amount of a nickel solution for a time period between $t_2$ and $t_3$ during another transition step. The cobalt-nickel material is deposited to form a layer with a thickness within a range from about a discontinuous atomic layer to about 100 Å, preferably, from about an atomic layer to about 50 Å, and more preferably, from about 5 Å to about 30 Å. The time period between $t_2$ and $t_3$ may be within a range from about 5 seconds to about 5 minutes, preferably, from about 10 seconds to about 3 minutes, and more preferably, from about 30 seconds to about 2 minutes.

A nickel material may be formed by exposing the substrate to a nickel solution for a time period between $t_3$ and $t_4$ during step 1030. The nickel material is deposited to form a layer with a thickness within a range from about a discontinuous atomic layer to about 100 Å, preferably, from about an atomic layer to about 50 Å, and more preferably, from about 5 Å to about 30 Å. The time period between $t_3$ and $t_4$ may be within a range from about 5 seconds to about 5 minutes, preferably, from about 10 seconds to about 3 minutes, and more preferably, from about 30 seconds to about 2 minutes.

Once the cobalt-nickel material is deposited to a predetermined thickness, the sequential electroless process may be complete at step 1040. However, multiple cycles of steps 1020 and 1030 and transition steps are repeated until the cobalt-nickel material is formed with a predetermined thickness. For example, a second cycle of steps 1020 and 1030 and transition steps may be completed during $t_4$-$t_8$ and a third cycle of steps 1020 and 1030 and transition steps may be completed during $t_8$-$t_{12}$ (FIG. 10). Usually, the cobalt-nickel material is deposited onto the substrate to fill any vias or apertures.

The substrate may be exposed to a chemical mechanical polishing (CMP) process prior to the pretreatment and deposition processes described herein. Usually, the CMP process is conducted in a first process chamber, the nickel-containing layer or cobalt-tungsten alloy layer may be deposited in a second process chamber and the first and second process chambers are on the same CMP tool. In one example, the first and second process chambers may be in fluid communication to an in-line mixing system that combines stock solutions used in the pretreatment process and/or the electroless deposition processes.

Nickel Electroless Process

In some embodiments, a nickel-containing material may be deposited as metal-containing layer 316 or metal contact material 320 on substrate 300 during steps 560, 660, or 760 of processes 500, 600, or 700. Nickel-containing materials may be deposited as capping layers or filling material by an electroless deposition process throughout embodiments described herein. Nickel-containing materials include metallic nickel, nickel boride, nickel phosphide, nickel boride phosphide, or other nickel alloys. The electroless deposition solution to form nickel-containing materials is an aqueous solution that generally contains a nickel source, a reductant, at least one complexing agent, a pH adjusting agent, and optional additives and surfactants. A nickel-containing material may be deposited by an electroless process utilizing either a pre-mixed electroless deposition solution or an in-line mixing process that combines solution components to generate the electroless solution.

The nickel source within the electroless deposition solution may have a concentration within a range from about 1 mM to about 150 mM, preferably, from about 5 mM to about 100 mM, and more preferably, from about 10 mM to about 80 mM, such as about 40 mM. Nickel sources provide nickel ions (e.g., $Ni^{2+}$) dissolved within the electroless solution and later reduced out as the deposited nickel-containing material. Useful nickel sources include nickel sulfate, nickel chloride, nickel acetate, nickel phosphate, derivatives thereof, hydrates thereof, or combinations thereof. In a preferred embodiment, nickel sulfate hexahydrate ($NiSO_4.6H_2O$) is used in the electroless solution to deposit nickel-containing materials.

The reductant within the electroless deposition solution may have a concentration within a range from about 1 mM to about 150 mM, preferably, from about 5 mM to about 100 mM, and more preferably, from about 10 mM to about 80 mM, such as about 40 mM. Reductants provide electrons to induce chemical reduction of the nickel ions that form and deposit the nickel-containing material. Reductants may include organic reductants (e.g., formaldehyde or glyoxylic acid), hydrazine, organic hydrazines (e.g., methyl hydrazine), hypophosphite sources (e.g., hypophosphorous acid ($H_3PO_2$), ammonium hypophosphite (($NH_4$)$_{4-x}H_xPO_2$) and salts thereof), borane sources (e.g., dimethylamine borane complex (($CH_3$)$_2NH.BH_3$), DMAB), trimethylamine borane complex (($CH_3$)$_3N.BH_3$), TMAB), tert-butylamine borane complex ($^tBuNH_2.BH_3$), tetrahydrofuran borane complex ($THF.BH_3$), pyridine borane complex ($C_5H_5N.BH_3$), ammonia borane complex ($NH_3.BH_3$), borane ($BH_3$), diborane ($B_2H_6$), derivatives thereof, complexes thereof, or combinations thereof. In a preferred embodiment, DMAB is used as a reductant in the electroless solution for depositing nickel-containing materials.

Chelators or complexing agents are in the electroless solution to complex nickel ions thereby stabilizing the solubility and reduction of nickel ions. The complexing agents may have a concentration of about 2 M or less, such as within a range from about 10 mM to about 500 mM, preferably, from about 50 mM to about 300 mM, and more preferably, from about 75 mM to about 200 mM, such as about 150 mM. Complexing agents generally may have functional groups, such as carboxylic acids, dicarboxylic acids, polycarboxylic acids, amino acids, amines, diamines, polyamines, alkylamines, alkanolamines, or alkoxyamines. Complexing agents may include citric acid, citrates, glycolic acid, glycine, malonic acid, maleic acid, lactic acid, ethylenediaminetetraacetic acid (EDTA), ethylenediamine (EDA), triethylene tetramine (TETA), diaminoethane, ethanolamine (EA), diethanolamine (DEA), triethanolamine (TEA), hydroxylamine hydrochloride, ammonia, ammonium chloride, derivatives thereof, salts thereof, or combinations thereof. Usually, the electroless solution contains more than one complexing agent. Preferably, the electroless solution contains at least citric acid or citrate salts, more preferably, the electroless solution also contains DEA, glycine, and/or lactic acid. In one example, the electroless solution contains about 45 mM of citric acid, about 16 mM of DEA, about 5 mM of glycine, and about 85 mM of lactic acid.

A pH adjusting agent may be added to adjust the electroless solution to a pH value within a range from about 8 to about 10, preferably, from about 8.5 to about 10, and more preferably, from about 9.0 to about 9.5, such as about 9.2. The pH adjusting agent may be an acidic compound to decrease the pH value of the electroless solution and include hydrochloric acid, sulfuric acid, phosphoric acid, derivatives thereof, or combinations thereof. Alternatively, the pH adjusting agent may be a basic compound to increase the pH value of the electroless solution and include metal hydroxides, tetraalkylammonium hydroxides (e.g., tetramethylammonium hydroxide (($CH_3$)$_4NOH$, TMAH) or tetraethylammonium hydroxide (($CH_3CH_2$)$_4NOH$, TEAH)), ammonium hydroxide, DEA, TEA, derivatives thereof, or combinations thereof. The pH adjusting agent may be dissolved in water prior to adjusting the pH value of the electroless solution. In one example, a 25 wt % aqueous solution of TMAH is used as a pH adjusting agent. In another example, both TMAH and DEA are used to adjust the pH value of an electroless solution.

The optional additives may include levelers, accelerators and suppressors. Levelers within the electroless solution are used to achieve different deposition thickness as a function of leveler concentration and feature geometry while depositing nickel-containing materials. The leveler within the electroless deposition solution may have a concentration within a range from about 20 ppb to about 600 ppm, preferably, from about 100 ppb to about 100 ppm. Examples of levelers that may be employed in an electroless solution include, but are not limited to alkylpolyimines and organic sulfonates, such as 1-(2-hydroxyethyl)-2-imidazolidinethione (HIT), 4-mercaptopyridine, 2-mercaptothiazoline, ethylene thiourea, thiourea, or derivatives thereof. The electroless deposition solution may contain brighteners or accelerators and suppressors as alternative additives to provide further control of the deposition process. The role of accelerators is to achieve a smoothly deposited surface of the nickel-containing material. The accelerator within the electroless deposition solution has a concentration within a range from about 20 ppb to about 600 ppm, preferably, from about 100 ppb to about 100 ppm. Accelerators that are useful in an electroless solution for depositing nickel-containing materials may include sulfur-based compounds such as bis(3-sulfopropyl) disulfide (SPS), 3-mercapto-1-propane sulfonic acid (MPSA), aminoethane sulfonic acids, thiourea, derivatives thereof, combinations thereof. Suppressors are used to suppress nickel deposition by initially adsorbing onto underlying catalytic surfaces and therefore blocking access to the catalyst of the reaction. Suppressors generally may include polyethylene glycol (PEG), polypropylene glycol (PPG), polyoxyethylene-polyoxypropylene copolymer (POCP), benzotriazole (BTA), dipyridyl, dimethyl dipyridyl, derivatives thereof, or combinations thereof. The suppressor within the electroless deposition solution has a concentration within a range from about 20 ppb to about 600 ppm, preferably, from about 100 ppb to about 100 ppm.

The electroless solution may contain boric acid as an additional additive. Boric acid is added to provide additional buffering and to stabilize the composition of the solution.

Boric acid is an oxidation by-product from the chemical reactions of borane reductants (e.g., DMAB). Therefore, an electroless solution containing boric acid is more normalized at the start of the deposition process since a less steep dissipation gradient exist as additional boric acid is formed from the borane reductant. Boric acid is preferably within the electroless deposition solution at concentration within a range from about 0.1 mM to about 50 mM, preferably, from about 0.5 mM to about 5 mM, and more preferably, from about 1 mM to about 3 mM, such as about 2 mM.

Also, an optional surfactant may be added to the electroless solution. The surfactant is a wetting agent to reduce the surface tension between the electroless solution and the substrate surface. Surfactants are generally added to the electroless solution at a concentration of about 1,000 ppm or less, preferably about 800 ppm or less, such as from about 20 ppb to about 600 ppm. The surfactant may have ionic or non-ionic characteristics. A preferred surfactant includes dodecyl sulfates, such as sodium dodecyl sulfate (SDS). Other surfactants that may be used in the electroless deposition solution include glycol ether based surfactants (e.g., polyethylene glycol). For example, a glycol ether based surfactants may contain polyoxyethylene units, such as TRITON® 100, available from Dow Chemical Company. A nonylphenol ethoxylate surfactant is useful in the electroless deposition solution, such as TERGITOL®, available from Dow Chemical Company or IGEPAL-630, available from GAF Corporation. Other useful surfactants may contain phosphate units, for example, sodium poly(oxyethylene) phenyl ether phosphate, such as RHODAFAC® RE-610, available from Rhodia, Inc. The surfactants may be single compounds or a mixture of compounds of molecules containing varying length of hydrocarbon chains.

An electroless process to deposit nickel-containing materials may utilize an in-line mixing process to form the electroless solution. The process may contain the addition of two, three, four or more componential solutions to form the electroless solution. In one example, the electroless solution is formed by combining a buffered complexing solution, a nickel-containing solution, a reducing solution and water, where each solution is a concentrate and water is added to reach a predetermined concentration of the final solution. In another example, the electroless solution is formed by combining a buffered complexing solution, a nickel-containing solution and a reducing solution, where each of the solutions are pre-diluted and therefore do not require additional water. In another example, the electroless solution is formed by combining a buffered nickel-containing solution, a reducing solution and water, where a buffered complexing solution and a nickel-containing solution are combined to form the buffered nickel-containing solution. Further details of in-line mixing processes and componential solutions are further described in the commonly assigned U.S. Ser. No. 10/967,919, entitled, "Selective Self-initiating Electroless Capping of Copper with Cobalt-containing Alloys," filed on Oct. 18, 2004, and published as US 2005-0136193, which is incorporated by reference to the extent not inconsistent with the claimed aspects and description herein.

A buffered complexing solution usually contains water, at least one complexing agent, additives and a pH adjusting agent. The complexing agent within the buffered complexing solution is at a concentration from about 0.1 M to about 3 M, preferably, from about 0.2 M to about 2 M. The additive within the buffered complexing solution is at a concentration from about 10 mM to about 1 M, preferably, from about 50 mM to about 500 mM. The pH adjusting agent is at a concentration to provide the buffered complexing solution with a pH value within a range from about 8 to about 11, preferably, from about 9 to about 10, and more preferably, from about 9.2 to about 9.6, such as about 9.4. In one example, a buffered complexing solution contains water, about 450 mM of DEA, about 300 mM of citric acid, about 150 mM of glycine, about 50 mM of boric acid and a concentration of TMAH to adjust the pH value to about 9.4. In another example, a buffered complexing solution contains water, about 1.15 M of DEA, about 375 mM of citric acid, about 300 mM of glycine, about 100 mM of boric acid and a concentration of TMAH to adjust the pH value to about 9.4. In another example, a buffered complexing solution contains water, about 330 mM of DEA, about 300 mM of citric acid, about 150 mM of glycine, about 50 mM of boric acid and a concentration of TMAH to adjust the pH value to about 9.4.

A nickel-containing solution usually contains water, a nickel source, at least one complexing agent, and a pH adjusting agent. The nickel source within the nickel-containing solution is at a concentration from about 50 mM to about 1 M, preferably, from about 100 mM to about 500 mM, such as about 300 mM. The complexing agent within the nickel-containing solution is at a concentration from about 0.2 M to about 2 M, preferably, from about 0.5 M to about 1 M. The pH adjusting agent is at a concentration to provide the nickel-containing solution with a pH value within a range from about 8 to about 11, preferably, from about 8.5 to about 10, and more preferably, from about 9 to about 9.5, such as about 9.2. In one example, a nickel-containing solution contains water, about 100 mM of citric acid, about 275 mM of nickel sulfate, about 567 mM of 85% lactic acid and a concentration of TMAH to adjust the pH value to about 9.2.

A reducing solution usually contains water, at least one reductant, at least one complexing agent and a pH adjusting agent. The reductant within the reducing solution is at a concentration from about 10 mM to about 500 mM, preferably, from about 50 mM to about 300 mM, such as about 200 mM. The complexing agent within the reducing solution is at a concentration from about 10 mM to about 200 mM, preferably, from about 50 mM to about 150 mM, such as about 100 mM. The pH adjusting agent is at a concentration to provide the reducing solution with a pH value within a range from about 8 to about 11, preferably, from about 9 to about 10, and more preferably, from about 9.0 to about 9.4, such as about 9.2. In one example, a reducing solution contains water, about 100 mM of citric acid, about 204 mM of DMAB, and a concentration of TMAH to adjust the pH value to about 9.2.

The electroless solution is preferably formed by in-line mixing process that combines various volumetric ratios of the buffered complexing solution, the nickel-containing solution, the reducing solution and water. In one example, one volumetric equivalent of a buffered complexing solution, two volumetric equivalents of a nickel-containing solution, two volumetric equivalents of a reducing solution, and five volumetric equivalents of deionized water are in-line mixed to form an electroless solution. That is, the volumetric ratio of the buffered complexing solution, the nickel-containing solution, the reducing solution, and the deionized water is 1:2:2:5. In another example of an electroless solution, a volumetric ratio of the buffered complexing solution, the nickel-containing solution, the reducing solution, and the water is 1:1:1:3. In a preferred example, the volumetric percentages of the buffered complexing solution, the nickel-containing solution, the reducing solution and the deionized water is about 3.5%, about 15%, about 20%, and about 61.5%, therefore, the volumetric ratio is about 1.0 to about 4.3 to about 5.7 to about 17.6.

In one embodiment, an electroless solution contains: nickel sulfate with a concentration within a range from about 1 mM to about 150 mM, preferably, from about 5 mM to about 100 mM, and more preferably, from about 10 mM to about 80 mM, such as about 40 mM; DMAB with a concentration within a range from about 1 mM to about 150 mM, preferably, from about 5 mM to about 100 mM, and more preferably, from about 10 mM to about 80 mM, such as about 40 mM; citric acid with a concentration within a range from about 5 mM to about 200 mM, preferably, from about 10 mM to about 100 mM, and more preferably, from about 30 mM to about 60 mM, such as about 45 mM; DEA with a concentration within a range from about 5 mM to about 100 mM, preferably, from about 10 mM to about 30 mM, such as about 16 mM; glycine with a concentration within a range from about 0.5 mM to about 100 mM, preferably, from about 1 mM to about 50 mM, and more preferably, from about 2 mM to about 10 mM, such as about 5 mM; boric acid with a concentration within a range from about 0.5 mM to about 50 mM, preferably, from about 1 mM to about 20 mM, and more preferably, from about 1 mM to about 5 mM, such as about 2 mM; lactic acid with a concentration within a range from about 10 mM to about 300 mM, preferably, from about 20 mM to about 200 mM, and more preferably, from about 50 mM to about 150 mM, such as about 85 mM; TMAH with a concentration to adjust the electroless solution to a have pH value within a range from about 8 to about 11, preferably, from about 8.5 to about 10, and more preferably, from about 9.0 to about 9.6, such as about 9.2.

In one embodiment, citrate is a preferred complexing agent and is present in each componential solution, such as the buffered complexing solution, the nickel-containing solution and the reducing solution. Citrate may be added as citric acid and/or as a citrate salt. Citrate plays an important role for buffering each of the individual componential solutions while being combined to form the plating solution. Citrates generally have poor solubility in water at high concentrations, while the componential solutions may have relatively concentrated solutions. If a substantial citrate concentration of the final electroless solution is desired, a single componential solution may not be capable of completely containing all the dissolved citrate. Therefore, the citrate may be dissolved in each componential solution to assure no formation of citrate precipitate, and subsequently combined with water forming the electroless solution at a final concentration.

The electroless deposition process may be conducted at a temperature within a range from about 35° C. to about 120° C., preferably, from about 60° C. to about 100° C., and more preferably, from about 75° C. to about 80° C. The water may be degassed, preheated and/or deionized water. Degassing the water reduces the oxygen concentration of the subsequently formed electroless solution. An electroless solution with a low oxygen concentration (e.g., less than about 100 ppm) may be used during the deposition process. Preheated water allows forming the electroless solution at a predetermined temperature just below the temperature used to initiate the deposition process, thereby shortening the process time.

The processes described herein may be performed in an apparatus suitable for performing an electroless deposition process (EDP). A suitable apparatus includes the SLIM-CELL™ processing platform that is available from Applied Materials, Inc., located in Santa Clara, Calif. The SLIM-CELL™ platform, for example, is an integrated system capable of etching a native oxide within a wet-clean cell during a BOE process and depositing cobalt-containing materials, cobalt-tungsten materials, cobalt-nickel materials, nickel-containing materials within an EDP cell. The SLIM-CELL™ platform generally includes a wet-clean cell or etch cell and one or more EDP cells as well as one or more pre-deposition or post-deposition cell, such as spin-rinse-dry (SRD) cells or annealing chambers. Process systems, platforms, chambers, and cells useful for wet clean processes and electroless deposition processes, as described herein, are further disclosed in commonly assigned U.S. Ser. No. 10/059,572, entitled "Electroless Deposition Apparatus," filed Jan. 28, 2002, and published as US 2003-0141018, U.S. Ser. No. 10/965,220, entitled, "Apparatus for Electroless Deposition," filed on Oct. 14, 2004, and published as US 2005-0081785, U.S. Ser. No. 10/996,342, entitled, "Apparatus for Electroless Deposition of Metals on Semiconductor Wafers," filed on Nov. 22, 2004, and published as US 2005-0160990, U.S. Ser. No. 11/043,442, entitled, "Apparatus for Electroless Deposition of Metals on Semiconductor Wafers," filed on Jan. 26, 2005, and published as US 2005-0263066, U.S. Ser. No. 11/175,251, entitled, "Apparatus for Electroless Deposition of Metals on Semiconductor Wafers," filed on Jul. 6, 2005, and published as US 2005-0260345, U.S. Ser. No. 11/192,993, entitled, "Integrated Electroless Deposition System," filed on Jul. 29, 2005, and published as US 2006-0033678, and U.S. Ser. No. 11/040,962, entitled, "Method and Apparatus for Selectively Changing Thin Film Composition During Electroless Deposition in a Single Chamber," filed on Jan. 22, 2005, and published as US 2005-0181226, which are each incorporated by reference to the extent not inconsistent with the claimed aspects and description herein.

Cobalt and Nickel Electroless Deposition Solutions and Processes Cobalt

In some embodiments, a cobalt material or a nickel material may deposited as metal-containing layer 316 or metal contact material 320 on substrate 300 during steps 560, 660, or 760 of processes 500, 600, or 700. In one embodiment, an electroless solution for depositing metallic cobalt contains: cobalt ions ($Co^{2+}$) with a concentration within a range from about 1 mM to about 100 mM, preferably, from about 5 mM to about 50 mM, and more preferably, from about 10 mM to about 20 mM, such as about 15 mM; hydrazine hydrate with a concentration within a range from about 100 mM to about 2 M, preferably, from about 200 mM to about 1 M, and more preferably, from about 300 mM to about 400 mM, such as about 500 mM; citric acid or citrate salt with a citrate concentration within a range from about 5 mM to about 200 mM, preferably, from about 10 mM to about 100 mM, and more preferably, from about 30 mM to about 70 mM, such as about 50 mM; and an optional pH adjusting agent (e.g., TMAH) with a concentration to adjust the electroless solution to a have pH value within a range from about 10 to about 14, preferably, from about 11.5 to about 13, and more preferably, from about 12.2 to about 12.8, such as about 12.5. In one example, a pH value is about 11.5 or higher, preferably, about 12.0 or higher, and more preferably, about 12.5 or higher. The electroless deposition process to deposit metallic cobalt may be conducted at a temperature within a range from about 35° C. to about 100° C., preferably, from about 60° C. to about 90° C., and more preferably, from about 70° C. to about 80° C., such as about 75° C.

Cobalt Boride

In one embodiment, an electroless solution for depositing cobalt boride contains: cobalt ions ($Co^{2+}$) with a concentration within a range from about 1 mM to about 150 mM, preferably, from about 10 mM to about 100 mM, and more preferably, from about 20 mM to about 80 mM, such as about 35 mM; DMAB with a concentration within a range from about 1 mM to about 100 mM, preferably, from about 5 mM to about 50 mM, and more preferably, from about 10 mM to about 40 mM, such as about 25 mM; chelating agent within a range from about 10 mM to about 500 mM, preferably, from about 50 mM to about 300 mM, and more preferably, from about 75 mM to about 250 mM, such as about 150 mM; ammonium fluoride within a range from about 1 mM to about 100 mM, preferably, from about 2 mM to about 50 mM, and more preferably, from about 5 mM to about 20 mM, such as about 11 mM; and an optional pH adjusting agent (e.g., TMAH) with a concentration to adjust the electroless solution to a have pH value within a range from about 8 to about 11, preferably, from about 8.5 to about 10, and more preferably, from about 9.0 to about 9.6, such as about 9.2. The electroless deposition process to deposit cobalt boride may be conducted at a temperature within a range from about 35° C. to about 100° C., preferably, from about 70° C. to about 90° C., and more preferably, from about 75° C. to about 85° C., such as about 80° C.

In another embodiment, an electroless solution for depositing cobalt boride contains: cobalt sulfate with a concentration within a range from about 1 mM to about 150 mM, preferably, from about 10 mM to about 100 mM, and more preferably, from about 20 mM to about 80 mM, such as about 35 mM; DMAB with a concentration within a range from about 1 mM to about 100 mM, preferably, from about 5 mM to about 50 mM, and more preferably, from about 10 mM to about 40 mM, such as about 25 mM; DEA within a range from about 1 mM to about 300 mM, preferably, from about 10 mM to about 100 mM, and more preferably, from about 30 mM to about 60 mM, such as about 45 mM; citric acid or citrate salt with a citrate concentration within a range from about 5 mM to about 500 mM, preferably, from about 30 mM to about 300 mM, and more preferably, from about 50 mM to about 150 mM, such as about 67 mM; lactic acid or lactate salt with a lactate concentration within a range from about 1 mM to about 100 mM, preferably, from about 10 mM to about 50 mM, and more preferably, from about 15 mM to about 25 mM, such as about 19 mM; glycine within a range from about 1 mM to about 100 mM, preferably, from about 5 mM to about 50 mM, and more preferably, from about 10 mM to about 20 mM, such as about 15 mM; boric acid within a range from about 0.5 mM to about 50 mM, preferably, from about 1 mM to about 10 mM, and more preferably, from about 2 mM to about 7 mM, such as about 5 mM; saccharin within a range from about 0.02 mM to about 0.5 mM, preferably, from about 0.05 mM to about 0.2 mM, and more preferably, from about 0.07 mM to about 0.15 mM, such as about 0.1 mM; ammonium fluoride within a range from about 1 mM to about 100 mM, preferably, from about 2 mM to about 50 mM, and more preferably, from about 5 mM to about 20 mM, such as about 11 mM; and an optional pH adjusting agent (e.g., TMAH) with a concentration to adjust the electroless solution to a have pH value within a range from about 8 to about 11, preferably, from about 8.5 to about 10, and more preferably, from about 9.0 to about 9.6, such as about 9.2. The electroless deposition process to deposit cobalt boride may be conducted at a temperature within a range from about 35° C. to about 100° C., preferably, from about 70° C. to about 90° C., and more preferably, from about 75° C. to about 85° C., such as about 80° C.

Cobalt Tungsten Boride

In one embodiment, an electroless solution for depositing cobalt tungsten boride contains: cobalt ions ($Co^{2+}$) with a concentration within a range from about 1 mM to about 100 mM, preferably, from about 5 mM to about 50 mM, and more preferably, from about 10 mM to about 20 mM, such as about 15 mM; tungstic acid or tungstate salt with a tungstate concentration within a range from about 0.1 mM to about 10 mM, preferably, from about 0.5 mM to about 5 mM, and more preferably, from about 1 mM to about 3 mM, such as about 2 mM; DMAB with a concentration within a range from about 1 mM to about 200 mM, preferably, from about 10 mM to about 100 mM, and more preferably, from about 30 mM to about 50 mM, such as about 40 mM; citric acid or citrate salt with a citrate concentration within a range from about 5 mM to about 500 mM, preferably, from about 30 mM to about 300 mM, and more preferably, from about 50 mM to about 150 mM, such as about 100 mM; and an optional pH adjusting agent (e.g., TMAH) with a concentration to adjust the electroless solution to a have pH value within a range from about 8 to about 11, preferably, from about 8 to about 10, and more preferably, from about 8.5 to about 9.5, such as about 8.9. The electroless deposition process to deposit cobalt tungsten boride may be conducted at a temperature within a range from about 35° C. to about 100° C., preferably, from about 60° C. to about 80° C., and more preferably, from about 65° C. to about 75° C., such as about 70° C.

Nickel Boride

In one embodiment, an electroless solution contains: nickel sulfate with a concentration within a range from about 1 mM to about 150 mM, preferably, from about 5 mM to about 100 mM, and more preferably, from about 10 mM to about 80 mM, such as about 40 mM; DMAB with a concentration within a range from about 1 mM to about 150 mM, preferably, from about 5 mM to about 100 mM, and more preferably, from about 10 mM to about 80 mM, such as about 40 mM; citric acid with a concentration within a range from about 5 mM to about 200 mM, preferably, from about 10 mM to about 100 mM, and more preferably, from about 30 mM to about 60 mM, such as about 45 mM; DEA with a concentration within a range from about 5 mM to about 100 mM, preferably, from about 10 mM to about 30 mM, such as about 16 mM; glycine with a concentration within a range from about 0.5 mM to about 100 mM, preferably, from about 1 mM to about 50 mM, and more preferably, from about 2 mM to about 10 mM, such as about 5 mM; boric acid with a concentration within a range from about 0.5 mM to about 50 mM, preferably, from about 1 mM to about 20 mM, and more preferably, from about 1 mM to about 5 mM, such as about 2 mM; lactic acid with a concentration within a range from about 10 mM to about 300 mM, preferably, from about 20 mM to about 200 mM, and more preferably, from about 50 mM to about 150 mM, such as about 85 mM; TMAH with a concentration to adjust the electroless solution to a have pH value within a range from about 8 to about 11, preferably, from about 8.5 to about 10, and more preferably, from about 9.0 to about 9.6, such as about 9.2. The electroless deposition process to deposit nickel boride may be conducted at a temperature within a range from about 35° C. to about 100° C., preferably, from about 65° C. to about 90° C., more preferably, from about 70° C. to about 85° C., and more preferably, from about 75° C. to about 80° C.

In another embodiment, an electroless solution for depositing nickel boride contains: nickel ions ($Ni^{2+}$) with a concentration within a range from about 1 mM to about 100 mM, preferably, from about 5 mM to about 50 mM, and more preferably, from about 10 mM to about 20 mM, such as about 15 mM; DMAB with a concentration within a range from about 1 mM to about 200 mM, preferably, from about 10 mM to about 100 mM, and more preferably, from about 30 mM to about 50 mM, such as about 40 mM; citric acid or citrate salt with a citrate concentration within a range from about 5 mM to about 300 mM, preferably, from about 10 mM to about 100 mM, and more preferably, from about 40 mM to about 60 mM, such as about 50 mM; lactic acid or lactate salt with a lactate concentration within a range from about 5 mM to about 300 mM, preferably, from about 10 mM to about 100 mM, and more preferably, from about 40 mM to about 60 mM, such as about 50 mM; and an optional pH adjusting agent (e.g., TMAH) with a concentration to adjust the electroless solution to a have pH value within a range from about 8 to about 11, preferably, from about 8 to about 10, and more preferably, from about 8.5 to about 9.5, such as about 8.9. The electroless deposition process to deposit nickel boride may be conducted at a temperature within a range from about 35° C. to about 100° C., preferably, from about 60° C. to about 80° C., and more preferably, from about 65° C. to about 75° C., such as about 70° C.

Nickel Tungsten Boride

In one embodiment, an electroless solution for depositing nickel tungsten boride contains: nickel ions ($Ni^{2+}$) with a concentration within a range from about 1 mM to about 100 mM, preferably, from about 5 mM to about 50 mM, and more preferably, from about 10 mM to about 20 mM, such as about 15 mM; tungstic acid or tungstate salt with a tungstate concentration within a range from about 0.1 mM to about 10 mM, preferably, from about 0.5 mM to about 5 mM, and more preferably, from about 1 mM to about 3 mM, such as about 2 mM; DMAB with a concentration within a range from about 1 mM to about 200 mM, preferably, from about 10 mM to about 100 mM, and more preferably, from about 30 mM to about 50 mM, such as about 40 mM; citric acid or citrate salt with a citrate concentration within a range from about 5 mM to about 300 mM, preferably, from about 10 mM to about 100 mM, and more preferably, from about 40 mM to about 60 mM, such as about 50 mM; lactic acid or lactate salt with a lactate concentration within a range from about 5 mM to about 300 mM, preferably, from about 10 mM to about 100 mM, and more preferably, from about 40 mM to about 60 mM, such as about 50 mM; and an optional pH adjusting agent (e.g., TMAH) with a concentration to adjust the electroless solution to a have pH value within a range from about 8 to about 11, preferably, from about 8 to about 10, and more preferably, from about 8.5 to about 9.5, such as about 8.9. The electroless deposition process to deposit nickel tungsten boride may be conducted at a temperature within a range from about 35° C. to about 100° C., preferably, from about 60° C. to about 80° C., and more preferably, from about 65° C. to about 75° C., such as about 70° C.

Cobalt Nickel Boride

In one embodiment, an electroless solution for depositing cobalt nickel boride contains: cobalt ions ($Co^{2+}$) with a concentration within a range from about 1 mM to about 100 mM, preferably, from about 5 mM to about 50 mM, and more preferably, from about 10 mM to about 20 mM, such as about 15 mM; nickel ions ($Ni^{2+}$) with a concentration within a range from about 1 mM to about 100 mM, preferably, from about 5 mM to about 50 mM, and more preferably, from about 10 mM to about 20 mM, such as about 15 mM; DMAB with a concentration within a range from about 1 mM to about 200 mM, preferably, from about 10 mM to about 100 mM, and more preferably, from about 30 mM to about 50 mM, such as about 40 mM; citric acid or citrate salt with a citrate concentration within a range from about 5 mM to about 500 mM, preferably, from about 30 mM to about 300 mM, and more preferably, from about 50 mM to about 150 mM, such as about 100 mM; and an optional pH adjusting agent (e.g., TMAH) with a concentration to adjust the electroless solution to a have pH value within a range from about 8 to about 11, preferably, from about 8 to about 10, and more preferably, from about 8.5 to about 9.5, such as about 8.9. The electroless deposition process to deposit cobalt nickel boride may be conducted at a temperature within a range from about 35° C. to about 100° C., preferably, from about 60° C. to about 80° C., and more preferably, from about 65° C. to about 75° C., such as about 70° C.

Cobalt Nickel

In one embodiment, an electroless solution for depositing cobalt nickel contains: cobalt ions ($Co^{2+}$) with a concentration within a range from about 1 mM to about 100 mM, preferably, from about 5 mM to about 50 mM, and more preferably, from about 10 mM to about 20 mM, such as about 15 mM; nickel ions ($Ni^{2+}$) with a concentration within a range from about 1 mM to about 100 mM, preferably, from about 5 mM to about 50 mM, and more preferably, from about 10 mM to about 20 mM, such as about 15 mM; hydrazine hydrate with a concentration within a range from about 100 mM to about 2 M, preferably, from about 200 mM to about 1 M, and more preferably, from about 300 mM to about 400 mM, such as about 500 mM; citric acid or citrate salt with a citrate concentration within a range from about 5 mM to about 500 mM, preferably, from about 30 mM to about 300 mM, and more preferably, from about 50 mM to about 150 mM, such as about 100 mM; and an optional pH adjusting agent (e.g., TMAH) with a concentration to adjust the electroless solution to a have pH value within a range from about 10 to about 14, preferably, from about 11.5 to about 13, and more preferably, from about 12.2 to about 12.8, such as about 12.5. The electroless deposition process to deposit cobalt nickel may be conducted at a temperature within a range from about 35° C. to about 100° C., preferably, from about 60° C. to about 90° C., and more preferably, from about 70° C. to about 80° C., such as about 75° C.

Cobalt Activation Solution

In one embodiment, a cobalt activation solution may be used to activate silicon-containing surfaces, such as a silicon surface or a metal silicide surface. The cobalt activation solution may contain a cobalt concentration within a range from about 1 mM to about 100 mM, a fluoride concentration within a range from about 10 mM to about 400 mM, and a hypophosphite concentration within a range from about 5 mM to about 150 mM. Preferably, an activation solution may contain a cobalt concentration within a range from about 5 mM to about 50 mM, a fluoride concentration within a range from about 20 mM to about 200 mM, and a hypophosphite concentration within a range from about 10 mM to about 80 mM. More preferably, an activation solution may contain a cobalt concentration within a range from about 10 mM to about 30 mM, a fluoride concentration within a range from about 50 mM to about 120 mM, and a hypophosphite concentration within a range from about 20 mM to about 60 mM. In one example, an activation solution contains a cobalt concentration of about 22 mM, a fluoride concentration of about 83 mM, and a hypophosphite concentration of about 43 mM.

In one embodiment, citrate is a preferred complexing agent and may be present in cleaning solutions, reducing solutions (e.g., $Ti^{3+}/Ti^{4+}$ complexes), cobalt-containing solutions, nickel-containing solutions or cobalt-nickel-containing solutions. Citrate may be added as citric acid and/or as a citrate salt. Citrate plays an important role of buffering the aforementioned solutions.

A "substrate surface," as used herein, refers to any substrate or material surface formed on a substrate upon which film processing is performed. For example, a substrate surface on which processing may be performed include materials such as monocrystalline, polycrystalline, or amorphous silicon, strained silicon, silicon on insulator (SOI), doped silicon, fluorine-doped silicate glass (FSG), silicon germanium, germanium, gallium arsenide, glass, sapphire, silicon oxide, silicon nitride, silicon oxynitride, or carbon doped silicon oxides, such as $SiO_xC_y$, for example, BLACK DIAMOND® low-k dielectric, available from Applied Materials, Inc., located in Santa Clara, Calif. Substrates may have various dimensions, such as 200 mm or 300 mm diameter wafers, as well as, rectangular or square panes. Embodiments as described herein provide processes to deposit metal-containing layers on many types of substrates and surfaces. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, and patterned or non-patterned wafers. Substrates made of glass or plastic, which, for example, are commonly used to fabricate flat panel displays and other similar devices, may also be used during embodiments described herein.

While foregoing is directed to the preferred embodiment of the invention, other and further embodiments of the invention may be devised without departing from the basic scope thereof, and the scope thereof is determined by the claims that follow.

The invention claimed is:

1. A composition of an activation solution, comprising:
   a cobalt source at a concentration within a range from about 1 mM to about 100 mM;
   a fluoride source at a concentration within a range from about 10 mM to about 400 mM; and
   a hypophosphite source at a concentration within a range from about 5 mM to about 150 mM.

2. The composition of claim 1, further comprising:
   a cobalt source at a concentration within a range from about 5 mM to about 50 mM;
   a fluoride source at a concentration within a range from about 20 mM to about 200 mM; and
   a hypophosphite source at a concentration within a range from about 10 mM to about 80 mM.

3. The composition of claim 2, further comprising:
   the cobalt source at a concentration within a range from about 10 mM to about 30 mM;
   the fluoride source at a concentration within a range from about 50 mM to about 120 mM; and
   the hypophosphite source at a concentration within a range from about 20 mM to about 60 mM.

4. The composition of claim 3, further comprising the cobalt source at a concentration of about 20 mM, the fluoride source at a concentration of about 80 mM, and the hypophosphite source at a concentration of about 40 mM.

5. The composition of claim 1, wherein the fluoride source comprises hydrogen fluoride.

6. The composition of claim 5, further comprising at least one alkanolamine compound.

7. The composition of claim 6, further comprising at least two alkanolamine compounds.

8. The composition of claim 6, wherein the at least one alkanolamine compound is selected from the group consisting of ethanolamine, diethanolamine, triethanolamine, derivatives thereof, and combinations thereof.

9. The composition of claim 8, wherein a molar ratio of a first alkanolamine compound to a second alkanolamine compound is within a range from about 1 to about 5.

10. The composition of claim 9, wherein the first alkanolamine compound is diethanolamine the second alkanolamine compound is triethanolamine.

11. The composition of claim 10, wherein the molar ratio is about 1.2.

12. The composition of claim 1, wherein the fluoride source has a chemical formula of $[R_4N][F]$, where each R is independently selected from the group consisting of hydrogen, an alkyl group, an alkanol group, derivatives thereof, and combinations thereof.

13. The composition of claim 12, wherein the fluoride source has a chemical formula of $[(HO(CH_2)_n)_m NH_{4-m}][F]$, where n=1, 2, 3, 4, or 5, and m=1, 2, 3, or 4.

14. The composition of claim 13, wherein the fluoride source has a chemical formula of $[(HOCH_2CH_2CH_2)_m NH_{4-m}][F]$, where m=1, 2, 3, or 4.

15. The composition of claim 1, wherein the fluoride source is selected from the group consisting of ethanolammonium fluoride, diethanolammonium fluoride, triethanolammonium fluoride, tetramethylammonium fluoride, ammonium fluoride, hydrogen fluoride, salts thereof, derivatives thereof, and combinations thereof.

16. The composition of claim 15, wherein the hypophosphite source is selected from the group consisting of sodium hypophosphite, potassium hypophosphite, ammonium hypophosphite, tetramethylammonium hypophosphite, salts thereof, derivatives thereof, and combinations thereof.

* * * * *